United States Patent [19]
Takayanagi et al.

[11] Patent Number: 5,459,338
[45] Date of Patent: Oct. 17, 1995

[54] GATE TURN-OFF THYRISTOR AND POWER CONVERTOR USING THE SAME

[75] Inventors: Yuji Takayanagi, Hitachi; Susumu Murakami, Katsuta; Yukimasa Satou; Satoshi Matsuyoshi, both of Hitachi; Yasuhiro Mochizuki, Katsuta; Hidekatsu Onose, Hitachi, all of Japan

[73] Assignee: Hitachi, Ltd., Tokyo, Japan

[21] Appl. No.: 18,421

[22] Filed: Feb. 17, 1993

[30] Foreign Application Priority Data

Feb. 20, 1992 [JP] Japan ................................ 4-033432
Feb. 28, 1992 [JP] Japan ................................ 4-042758

[51] Int. Cl.⁶ .......................... H01L 29/68; H01L 29/72; H01L 29/76
[52] U.S. Cl. .......................... 257/119; 257/138; 257/139; 257/147; 257/155
[58] Field of Search .......................... 257/138, 139, 257/147, 155, 156, 149, 119

[56] References Cited

U.S. PATENT DOCUMENTS

| 4,654,679 | 3/1987 | Muraoka | 257/149 |
| 4,745,513 | 5/1988 | McMurray | 257/119 |

FOREIGN PATENT DOCUMENTS

| 0129909A2 | 6/1984 | European Pat. Off. | 257/119 |
| 0141624A2 | 10/1984 | European Pat. Off. | 257/119 |
| 0141624A3 | 10/1984 | European Pat. Off. | 257/119 |
| 0215489 | 3/1987 | European Pat. Off. | |
| 3733100 | 4/1988 | Germany | 257/149 |
| 9219963 | 5/1983 | Japan | 257/147 |
| 1189667 | 8/1986 | Japan | 257/138 |
| 0260152 | 12/1986 | Japan | 257/139 |
| 2177967 | 8/1987 | Japan | 257/149 |
| 63-186473 | 8/1988 | Japan . | |
| 1165169 | 6/1989 | Japan | 257/147 |
| 2076233 | 5/1981 | United Kingdom | 257/119 |

OTHER PUBLICATIONS

Patent Abstracts of Japan, vol. 14, No. 515 (E–1000), Nov. 13, 1990.
Patent Abstracts of Japan, vol. 13, No. 184, (E–751), Apr. 28, 1989.

*Primary Examiner*—William L. Sikes
*Assistant Examiner*—Fetsum Abraham
*Attorney, Agent, or Firm*—Antonelli, Terry, Stout & Kraus

[57] ABSTRACT

A gate turn-off thyristor having a p-emitter layer in the anode side, an n-base layer, a p-base layer and an n-emitter layer in the cathode side. The n-base layer is composed of a first layer portion adjacent to the p-emitter layer, a second layer portion adjacent to the p-base layer and having a lower impurity concentration than the first layer portion, and is constituted by a structure which alters a travelling path of positive holes injected from the p-emitter layer.

34 Claims, 24 Drawing Sheets

GATE TURN-OFF THYRISTOR AND POWER CONVERTOR USING THE SAME

BACKGROUND OF THE INVENTION

This invention relates to an improved gate turn-off thyristor (hereinafter referred to as "GTO") capable of cutting off a large current quickly and having a low turn-off loss and a power convertor using the thyristors.

Turn-off of the GTO is effected by extracting an anode current to a gate electrode by applying a reverse bias to a gate. Positive holes, that are injected from a p-emitter layer while the anode current is being eliminated, concentrate on a central portion of an n-emitter layer which is spaced apart from the gate electrode. When an area of a conduction region is extremely small and a turn-off time is long in a GTO for controlling a large current, thermal breakdown of the device is likely to occur due to the current concentration on the conduction region. A scheme for solving this problem has earlier been proposed in JP-A-59-132665. This scheme included forming an n-type impurity region having a high impurity concentration in such a manner as to come into contact with a p-emitter layer opposing an n-emitter layer. According to this structure, the positive holes injected from the p-emitter layer into the high concentration n-type impurity region are reduced by re-coupling (i.e. recombination), so that injection efficiency from the high concentration n-type impurity region is lowered and injection of the positive holes into the central portion of the n-emitter layer can be reduced. In devices for controlling a large current, however, the number of the positive holes injected from the p-emitter layer under a steady ON state is sufficiently greater than the impurity concentration of the high concentration n-type impurity region, and the major portion of the positive holes injected into the high concentration n-type impurity region reach the n-emitter layer without re-coupling. Therefore, the problem described above cannot be solved reliably.

A p-n-i-p-n structure wherein an n-base layer comprises a first layer portion having a low impurity concentration and a second layer portion having a high impurity concentration has been employed in GTOs having a high withstand voltage so as to increase an ON voltage and to prevent the drop of an operation speed (JP-A-63-205954). To form the second layer portion in this case, a method of forming the second layer portion by the diffusion of an impurity from a main plane on an anode side and a method of forming it by epitaxial growth of a high impurity concentration layer on the main plane of the first layer portion are generally known.

Further, the use of an anode short-circuit structure in combination with the p-n-i-p-n structure has also been employed to accomplish GTOs having a higher withstand voltage and excellent turn-OFF performance (JP-A-63-186473).

Nonetheless, the prior art described above does not consider the recoupling of carriers in a high concentration impurity region formed inside an n-base layer under a steady ON state in GTOs for controlling a large current density, and is not free from the problem that the current concentration occurs in the GTOs for controlling a large current, and their breakdown voltage is low. In GTOs having a high withstand voltage, on the other hand, the increase of the thickness of the n-base layer is unavoidable, and damping of a tail current gets retarded. The breakdown voltage of the GTOs according to the prior art is at most 4.5 KV, and a controllable current is at most 3 KA. The capacity of a unit inverter using such GTOs is as small as 8.3 MVA, and a greater capacity is difficult to attain.

SUMMARY OF THE INVENTION

It is an object of the present invention to provide a GTO solving the problems described above and a power convertor using such GTOs.

It is another object of the present invention to provide a GTO capable of mitigating current concentration and a power convertor using such GTOs.

It is still another object of the present invention to provide a GTO capable of quickly discharging carriers remaining inside an n-base layer and speeding up damping of a tail current, and a power convertor using such GTOs.

Other objects of the present invention will become more apparent from the explanation of preferred embodiments thereof.

The objects of the invention described above can be accomplished by a gate turn-off thyristor comprising: a semiconductor substrate (or semiconductor body) having a pair of main planes, and including, between the main planes, one of emitter layers (or first emitter layer) of a first conductivity type being disposed adjacent to one of the main planes, one of base layers (or first base layer) of a second, opposite conductivity type, and being disposed adjacent to one of the emitter layers, the other of the base layers (or a second base layer) of the first conductivity type, and being disposed adjacent to the said one of the base layers and to the other of the main planes, and the other of the emitter layers (or second emitter layer) of the second conductivity type, and being adjacent to the said other of the base layers and to the other of the main planes; one of the base layers comprising a first layer portion adjacent to one of the emitter layers, and a second layer portion adjacent to the other of the base layers and having a lower impurity concentration than the first layer portion; one of main electrodes coming into ohmic contact with one of the emitter layers on one of the main planes of the semiconductor substrate; the other of the main electrodes coming into ohmic contact with the other of the emitter layers on the other of the main planes of the semiconductor substrate; and a control electrode coming into ohmic contact with the other of the base layers on the other of the main planes of the semiconductor substrate; wherein there is disposed means for changing a travelling path of carriers injected from one of the emitter layers into one of the base layers and travelling to the other of the emitter layers. Typically, the means for changing the travelling path of the carriers is inclusive of the following two means:

1. A third layer portion having a higher impurity concentration than the first and second layer portions is disposed partially inside one of the base layers in such a manner as to be spaced apart from one of the emitter layers and from the other of the base layers but to be disposed adjacent to at least one of the first and second layer portions on a plane which is in parallel with one of the main planes.

2. An insulating layer or a semi-insulating layer is disposed in place of the third layer portion described above.

The third layer portion, the insulating layer and the semi-insulating layer may be disposed at the boundary (or interface) between the first and second layer portions, or may be disposed in such a manner that when they are projected on one of the main planes, they overlap, or do not overlap, mutually with the other emitter layer, or in such a manner that when they are projected on one of the main planes, they overlap, or do not overlap, mutually with an anode short-circuit portion of one of the base layers. These structures are selected appropriately so as to satisfy the specification required for the object GTOs.

A power convertor for accomplishing the aforementioned objects of the present invention comprises the same number of A.C. terminals as the number of phases of an A.C. output; and the same number of power conversion units as the number of the phases of the A.C. output, each of the power conversion units being connected between a pair of D.C. terminals, and comprising a series circuit of two parallel circuits each comprising a gate turn-off thyristor and a diode having an opposite polarity to the polarity of the thyristor, mutual junctions of the parallel circuits being connected to different A.C. terminals; wherein each of the thyristor comprises a semiconductor substrate having a pair of main planes, and including between the main planes, one of emitter layers having a first conductivity types, and being adjacent to one of the main planes, one of base layers having a second, opposite conductivity type, and being adjacent to one of the emitter layers, the other of the base layers having the first conductivity type, and being adjacent to one of the base layers and to the other of the main planes, and the other of the emitter layers having the second conductivity type, and being adjacent to the other of the base layers and to the other of the main planes; one of the base layers comprising a first layer portion adjacent to one of the emitter layers, and a second layer portion adjacent to the other of the base layers and having a lower impurity concentration than the first layer portion; one of main electrodes coming into ohmic contact with one of the emitter layers on one of the main planes of the semiconductor substrate; the other of the main electrodes coming into ohmic contact with the other of the emitter layers on the other of the main planes of the semiconductor substrate; and a control electrode coming into ohmic contact with the other of the base layers on the other of the main planes of the semiconductor substrate; wherein there is disposed means for changing a travelling path of carriers injected from one of the emitter layers into one of the base layers and travelling to the other of the emitter layers. This power convertor can be used as a convertor for converting A.C. power to D.C. power and a inverter for inverting D.C. power to A.C. power, for example.

The GTO according to the present invention includes means for changing the travelling path of the carriers injected from one of the emitter layers into one of the base layers and travelling to the other of the emitter layers, that is, the third layer portion. Therefore, the carriers injected from one of the emitter layers are divided into those which are injected into the third layer portion and those which pass in such a manner as to avoid the third layer portion. The carriers injected into the third layer portion vanish upon recoupling. i.e. during recombination of holes with electrons. As a result, the positive hole concentration and the electron concentration immediately below the central portion of the other of the emitter layers under the steady ON state can be reduced more greatly than at the portion immediately below the peripheral portion of the other of the emitter layers, and current concentration can be mitigated at the time of turn-OFF. When the semi-insulating layer or the insulating layer is disposed as means for changing the travelling path of the carriers, too, the travelling path of the carriers injected from one of the emitter layers is so changed as to avoid the semi-insulating layer or the insulating layer and to reach the other of the emitter layers. As a result, the positive hole concentration and the electron concentration immediately below the central portion of the other of the emitter layers under the steady ON state can be reduced more greatly than at the portion immediately below the peripheral portions of the other of the emitter layers, though the reducing effect is somewhat lower than when the third layer portion is disposed. Accordingly, the current concentration can be mitigated at the time of turn-OFF.

In the GTO according to the present invention, the third layer portion is structured in such a manner as to overlap with an anode short-circuit portion of one of the base layers when it is projected on one of the main planes. According to this structure, the carriers remaining inside one of the base layers at the time of turn-OFF can be attracted to the third layer portion and can be discharged from the anode short-circuit portion to the anode electrode. In this way, a tail current can be reduced. When the semi-insulating layer or the insulating layer is disposed, too, such a layer is disposed in such a manner as not to overlap with the anode short-circuit portion of one of the base layer, or in other words, in such a manner as to overlap with one of the emitter layers, when the semi-insulating layer or the insulating layer is projected on one of the main planes. According to this structure, the carriers remaining in one of the base layers can be discharged more quickly from the anode short-circuit portion to the anode electrode, and in this way, the tail current can be reduced.

As described above, the present invention can solve the problems encountered when the withstand voltage and the current of the GTO are to be increased, and can accomplish the GTOs having a higher withstand voltage and capable of handling a greater current. As a result, the capacity in one arm-one GTO of the power convertor using the GTOs can be increased, the numbers of parallel and series connections of the GTOs can be reduced, and control becomes easier.

Figure 8:
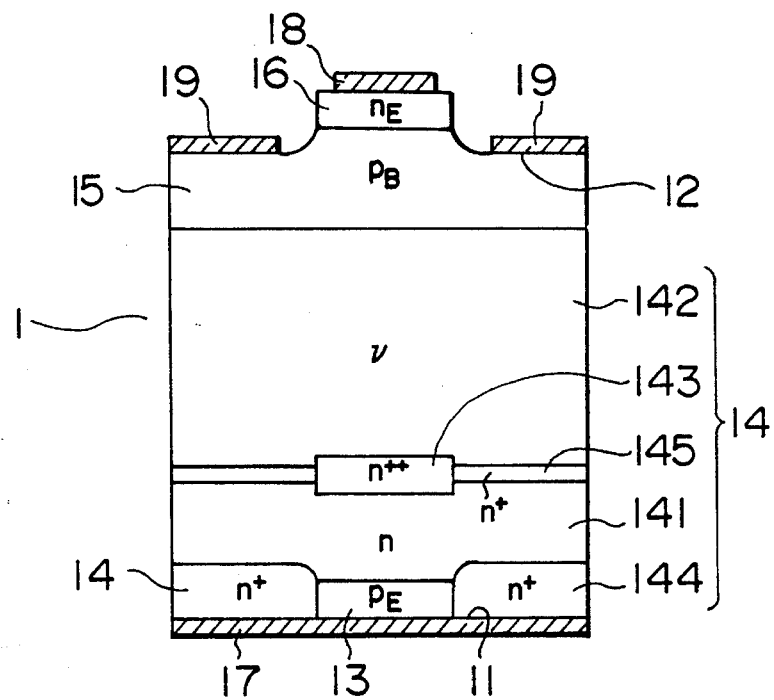
FIG. 8 is a schematic sectional view showing a GTO according to still another embodiment of the present invention.
Figure 10:
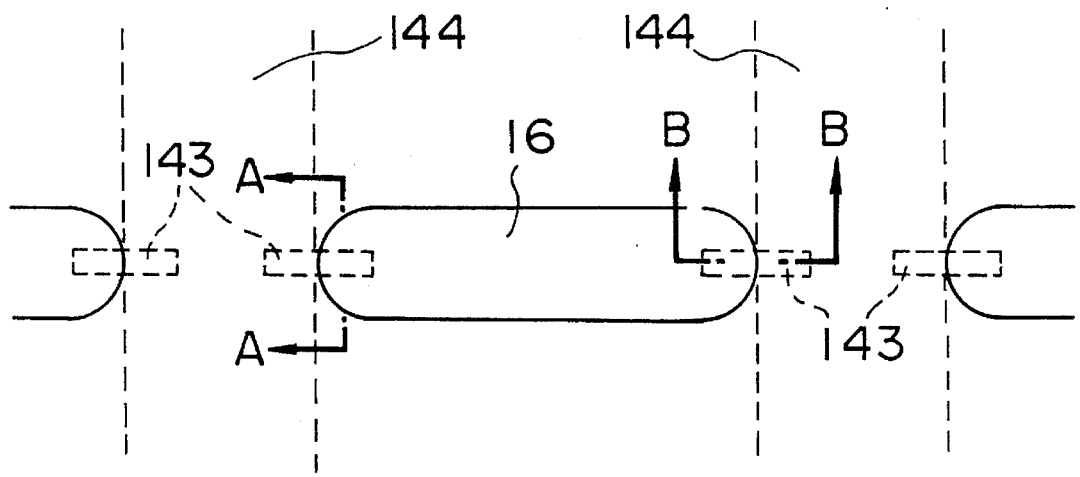
FIG. 10 is a plan view showing an improvement of the GTO according to the embodiment of the present invention shown in FIG. 5.
Figure 12:
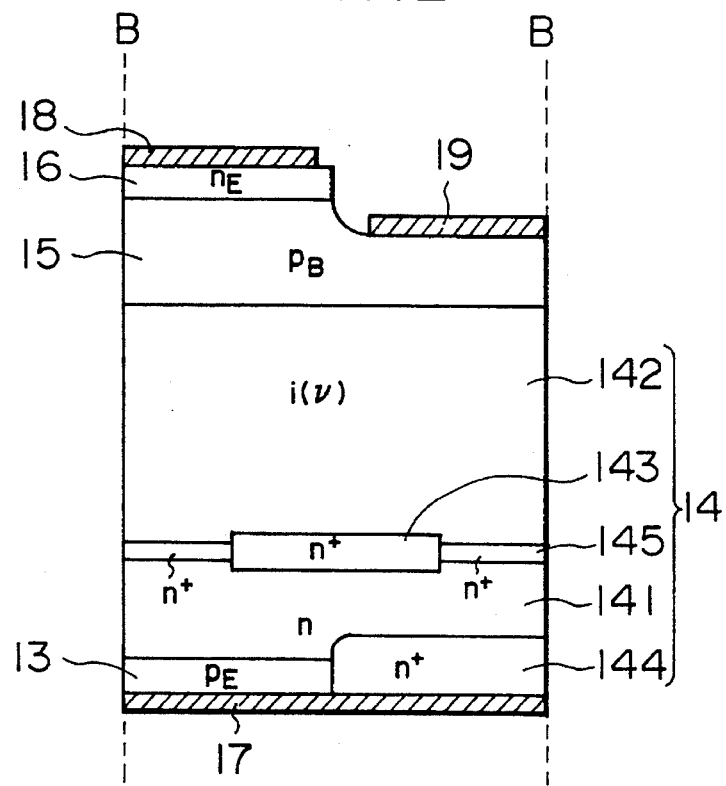
Figure 13:
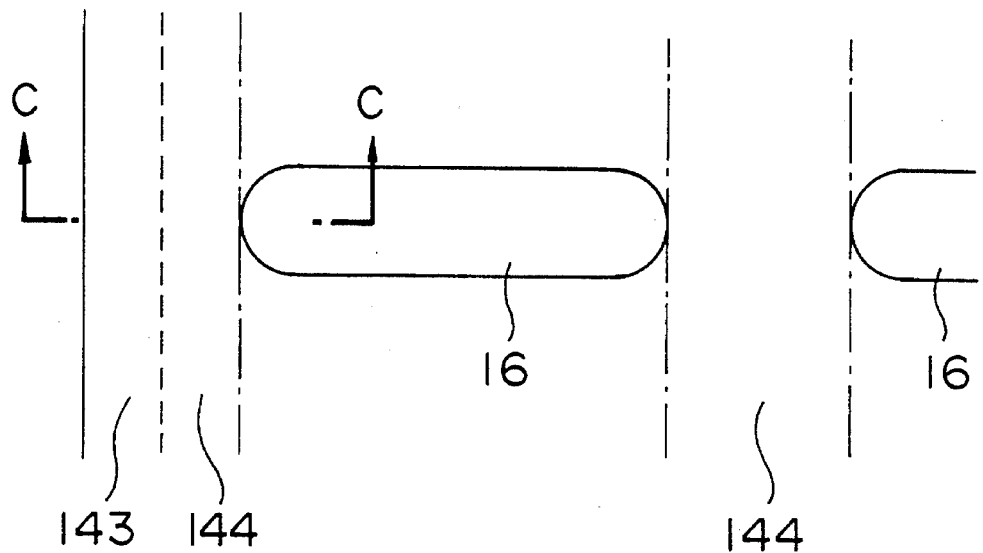
Figure 14:
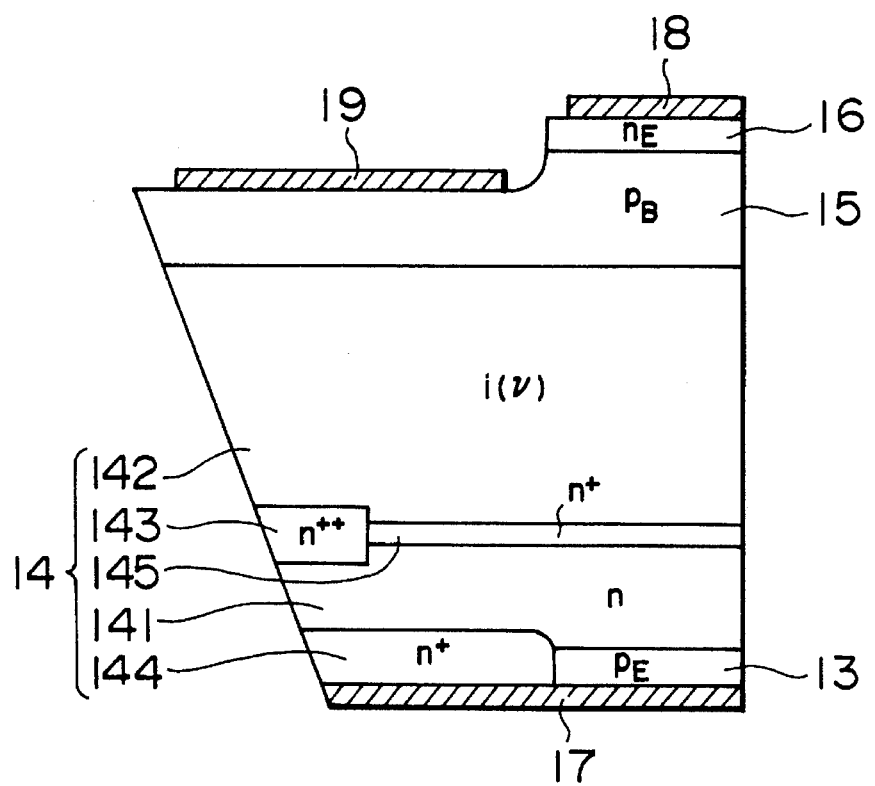
Figure 15:
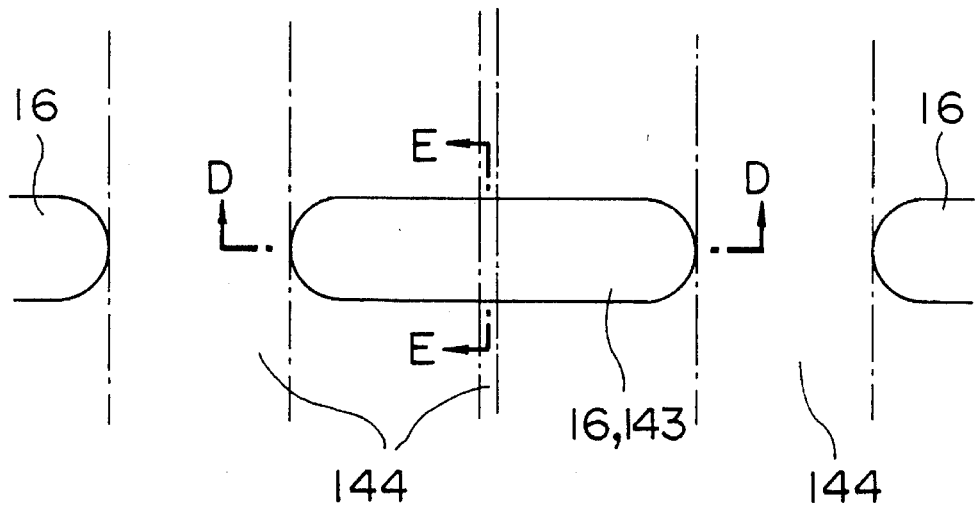
Figure 16:
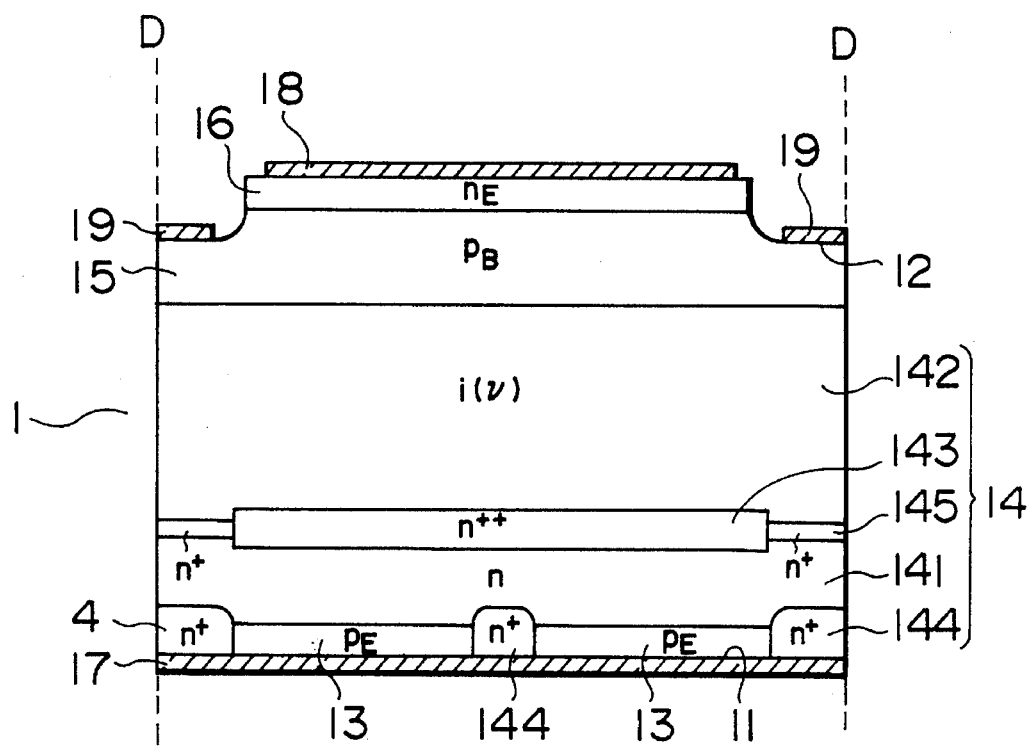
Figure 17:
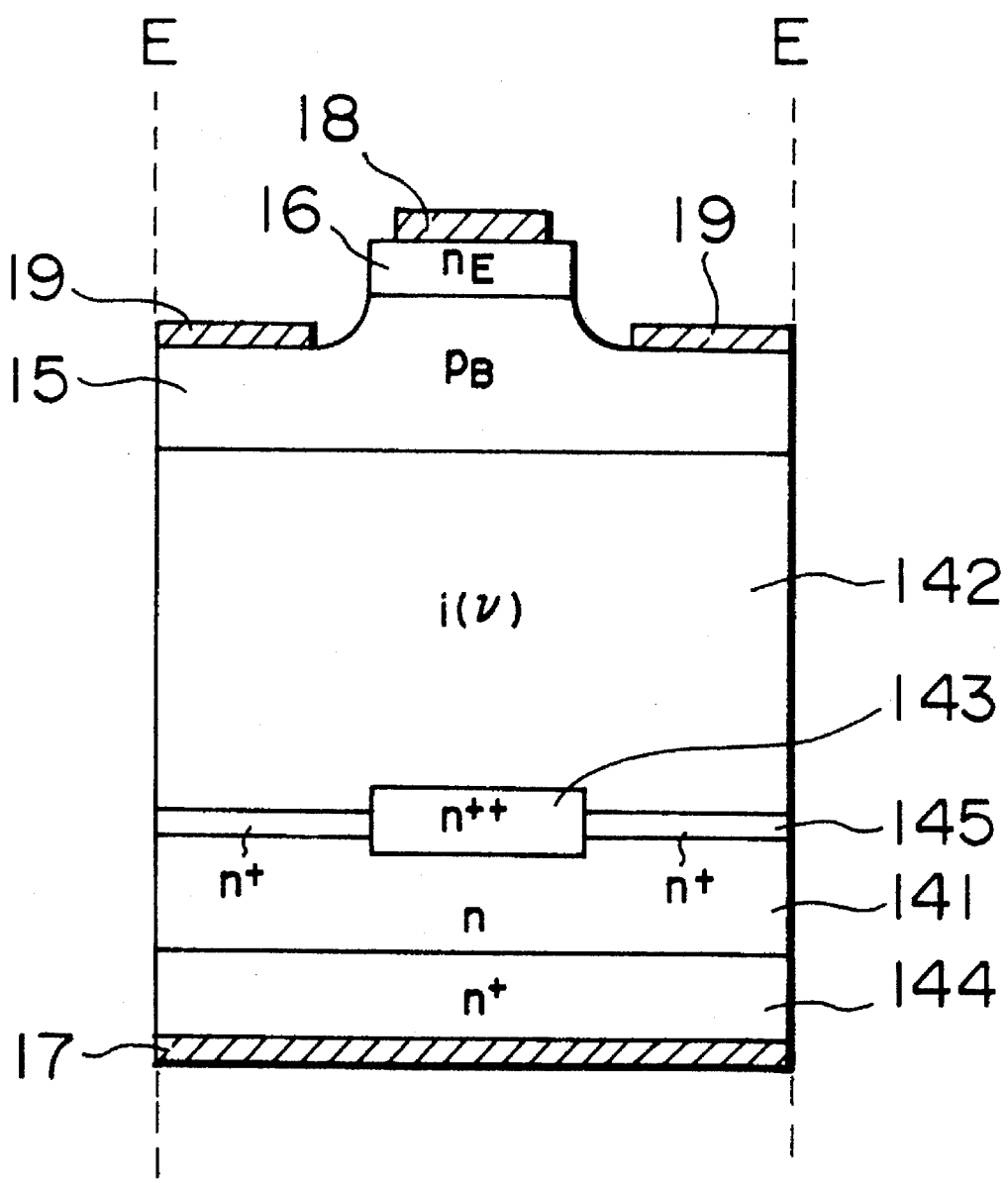
Figure 18:
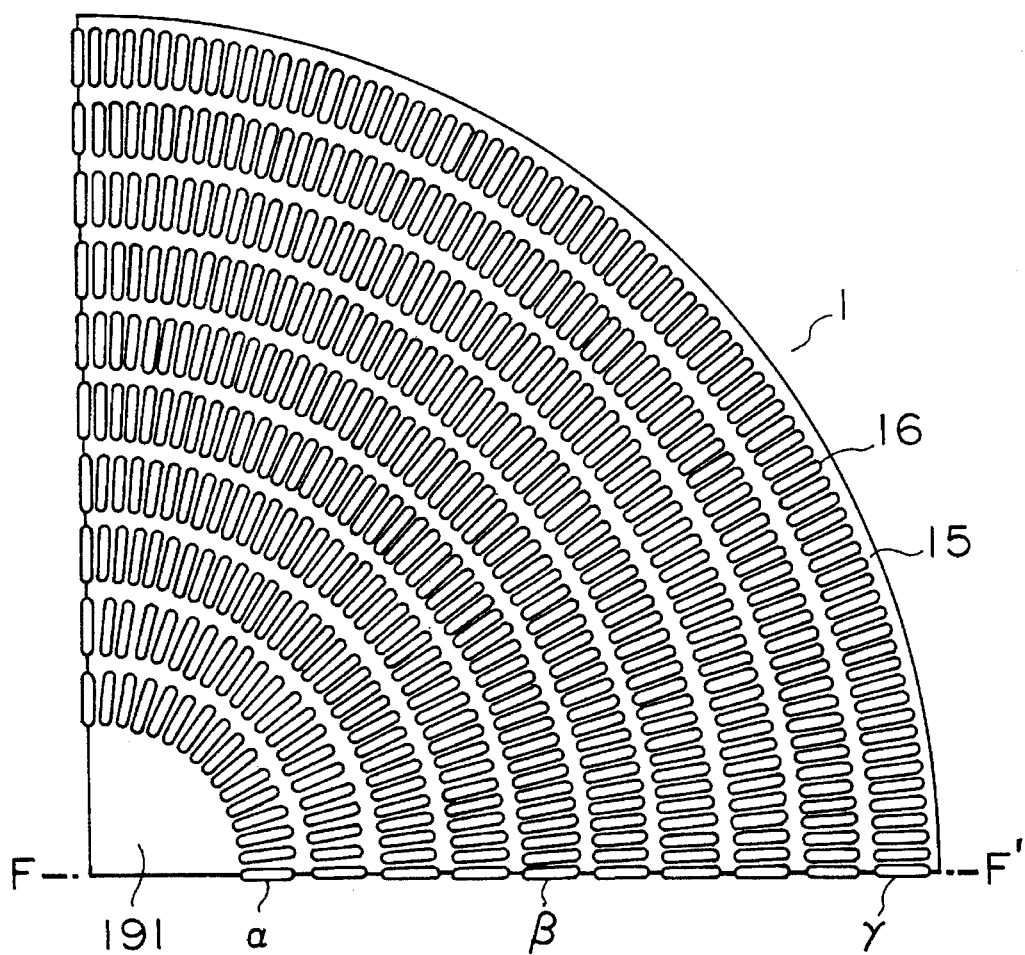
Figure 19:
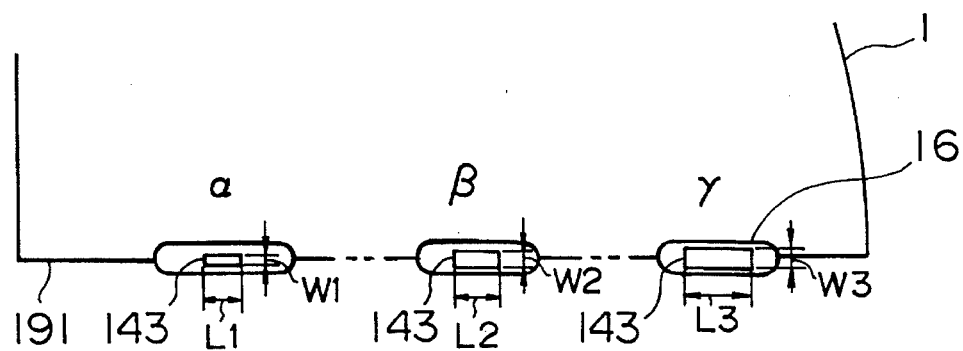
Figure 20:
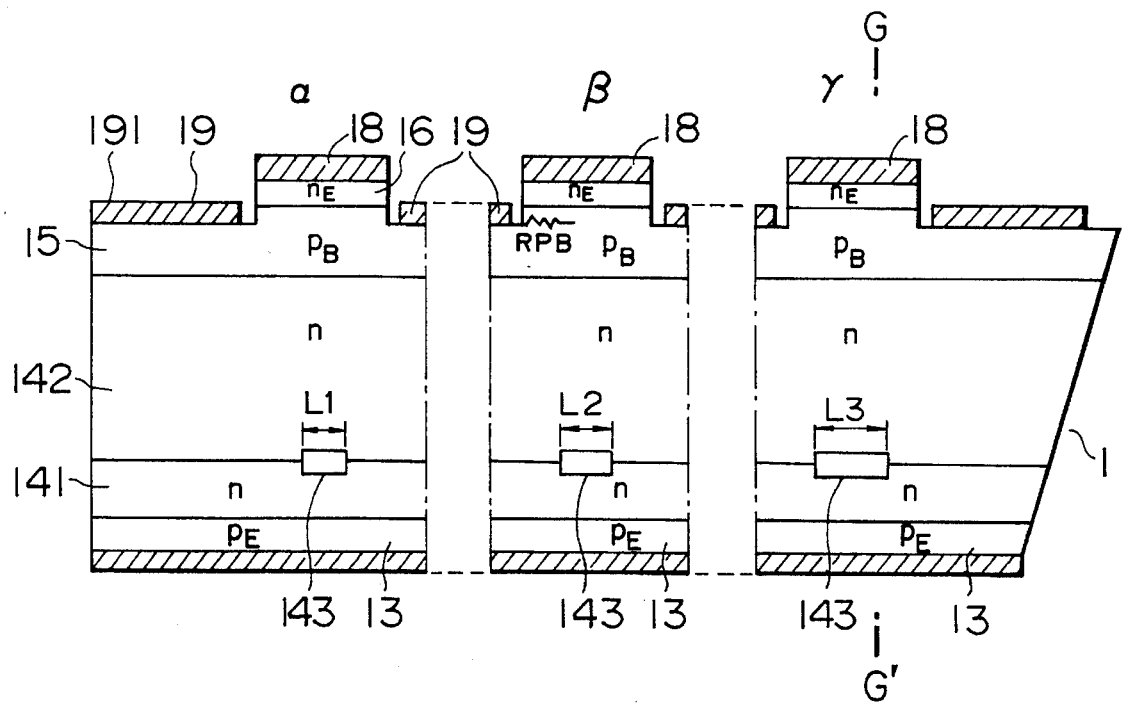
Figure 21:
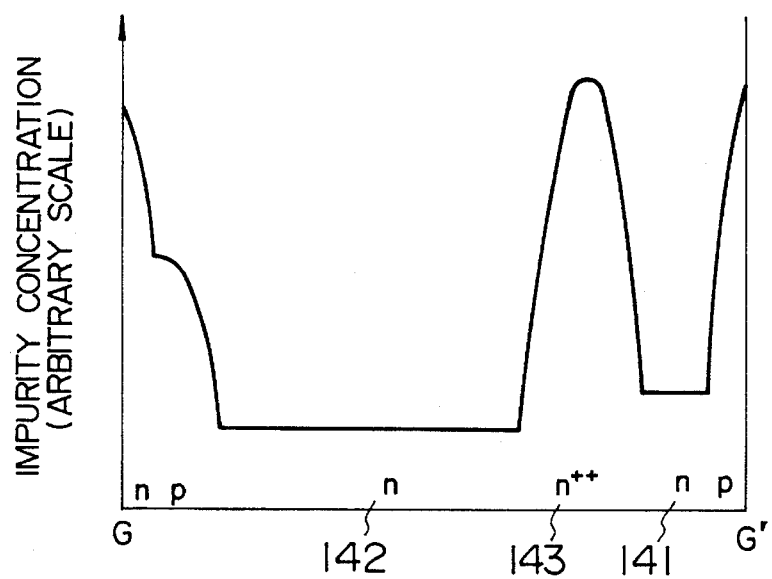
Figure 22:
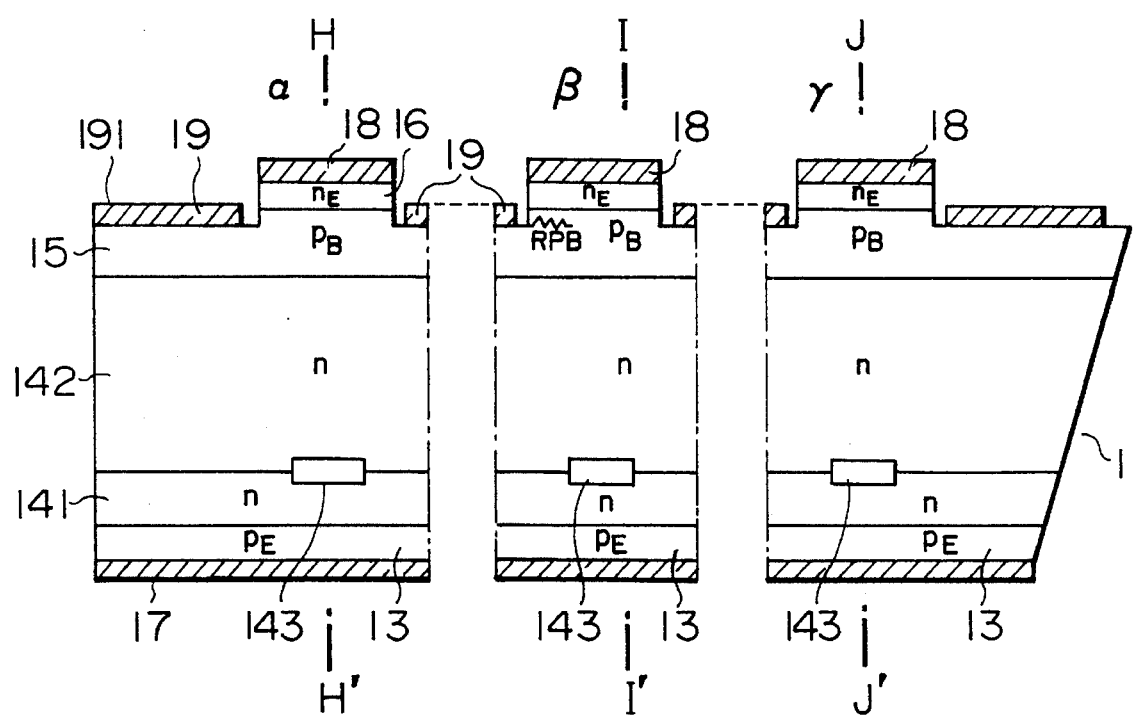
Figure 23:
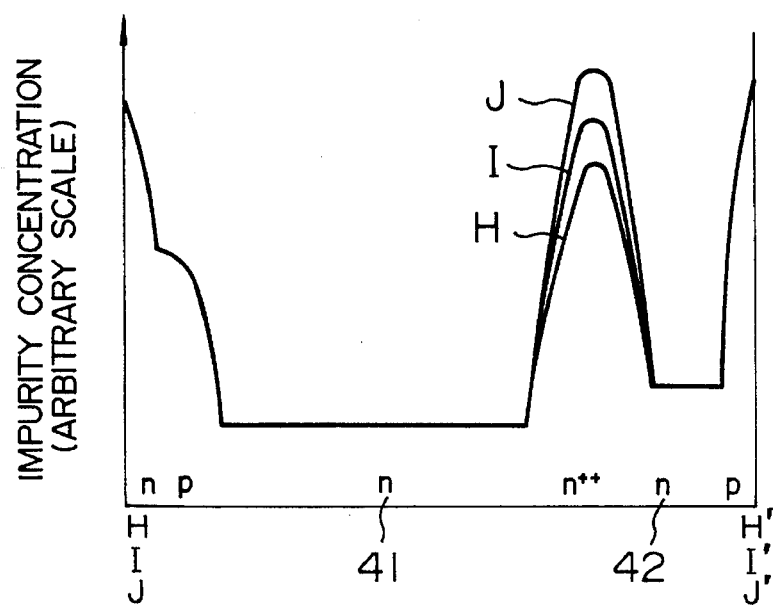
Figure 24:
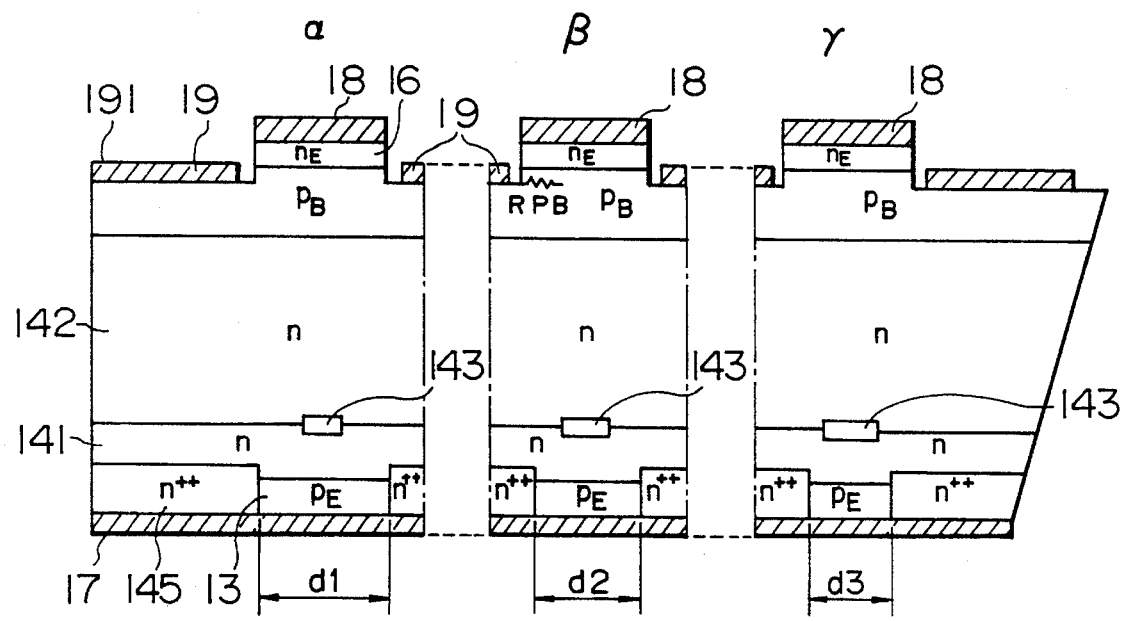
Figure 25:
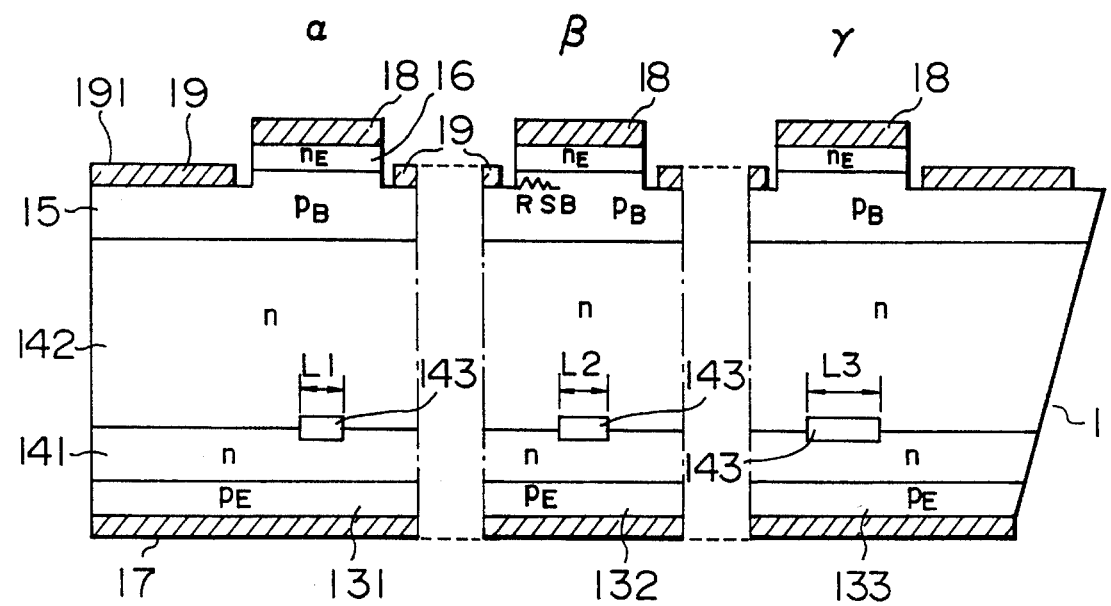
Figure 26:
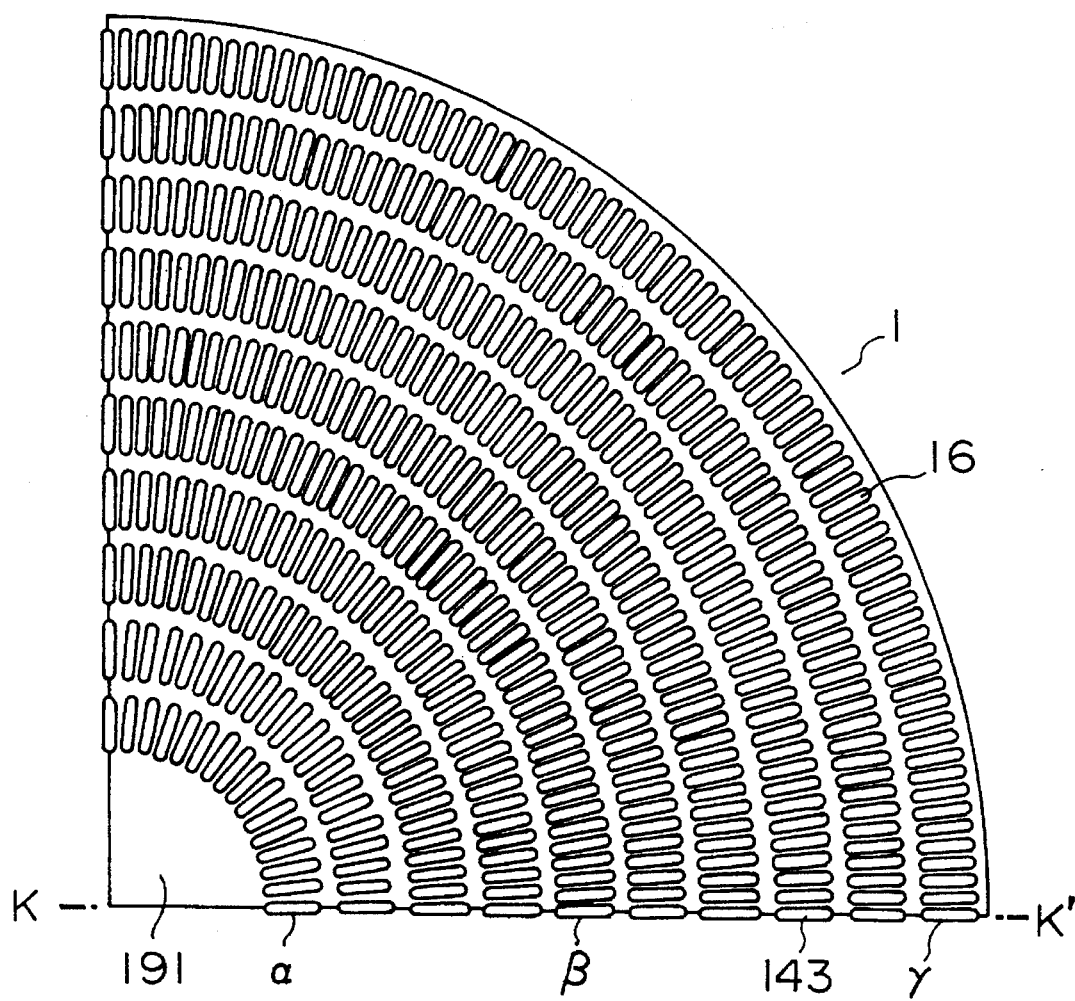
Figure 27:
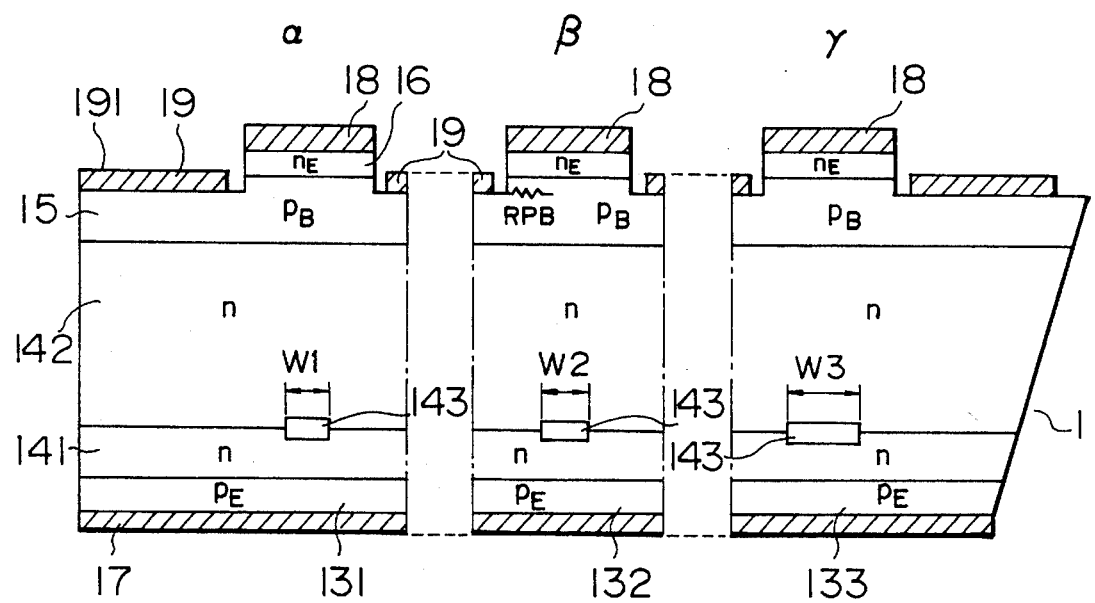
Figure 28:
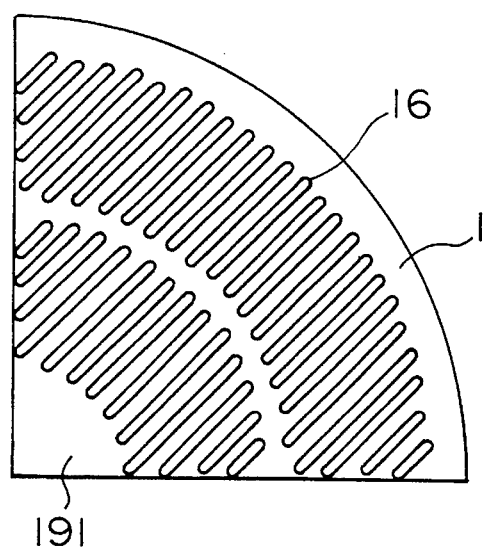
Figure 29:
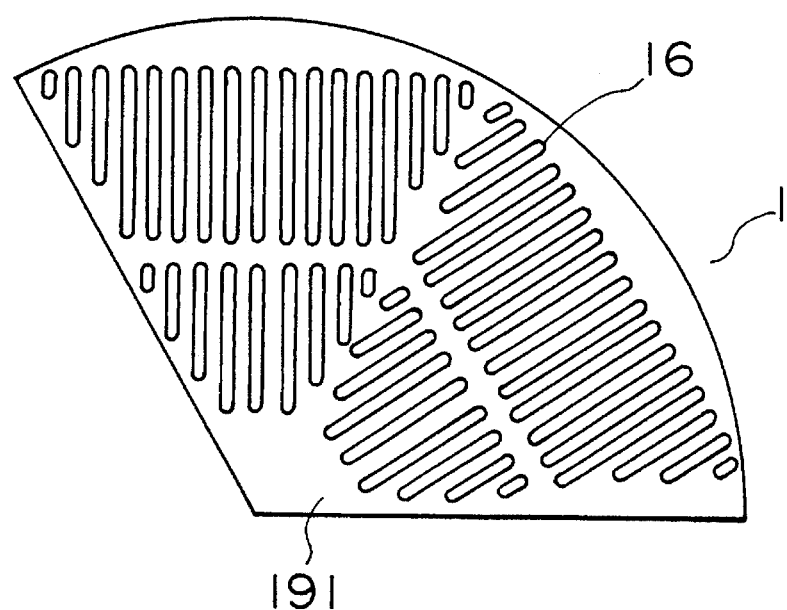
Figure 30:
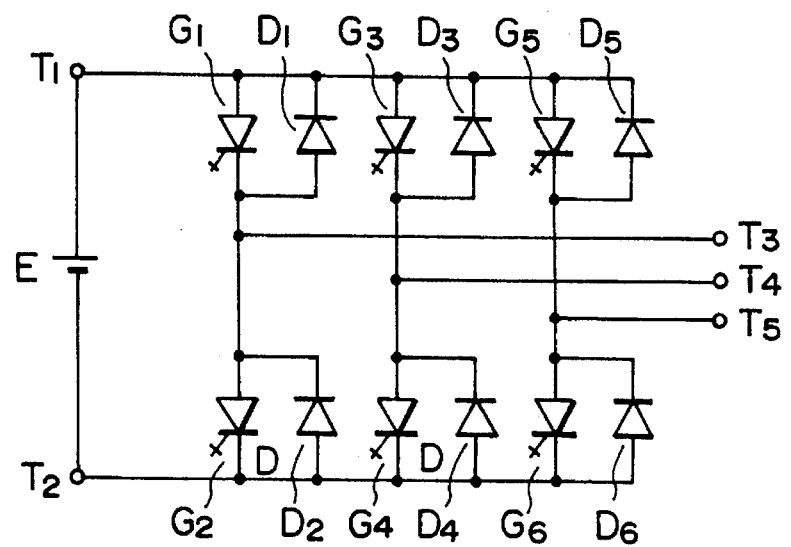
Figure 31:
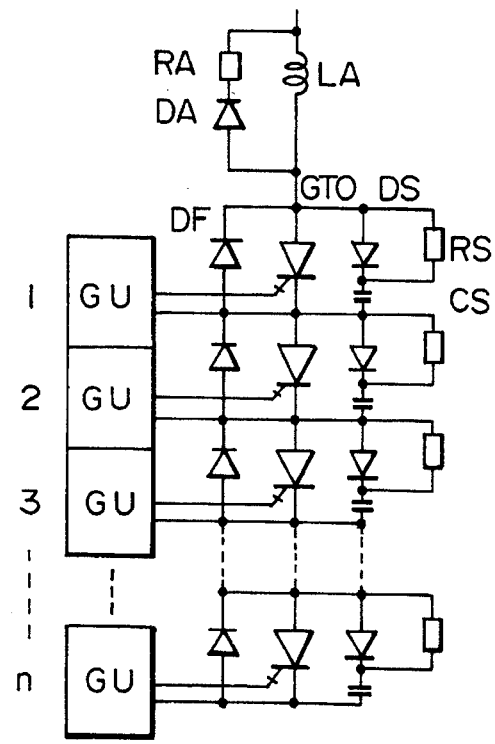
Figure 32:
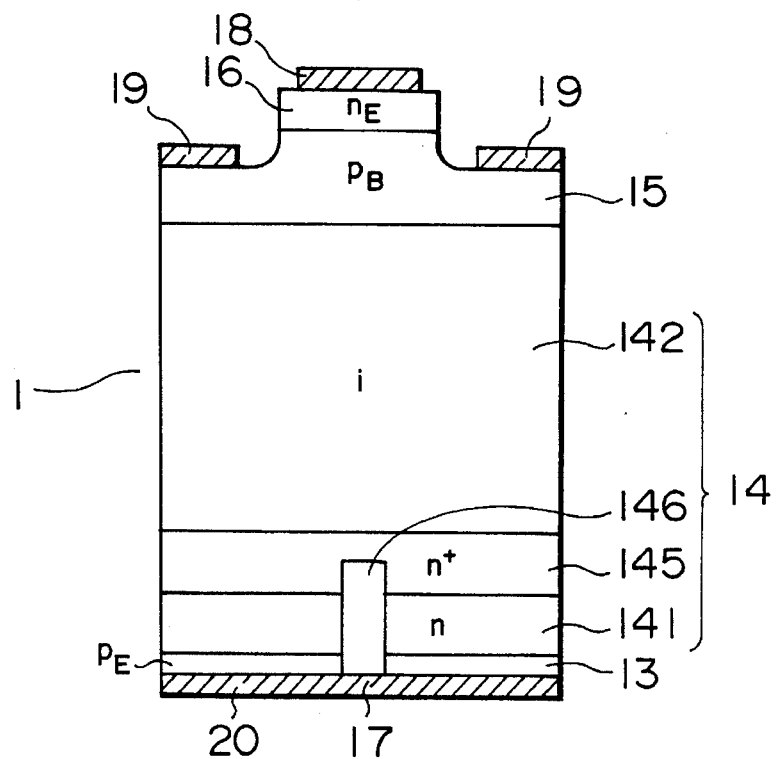
Figure 33:
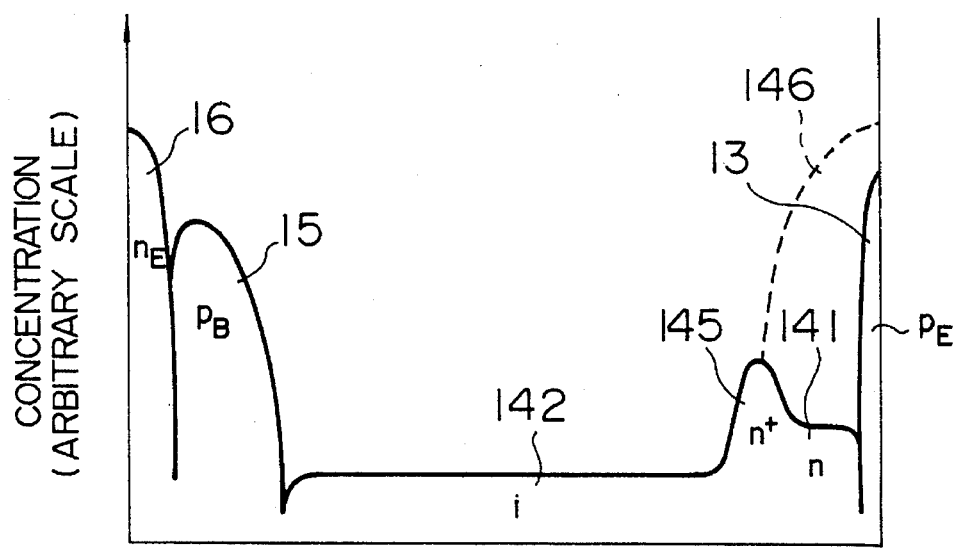
Figure 34:
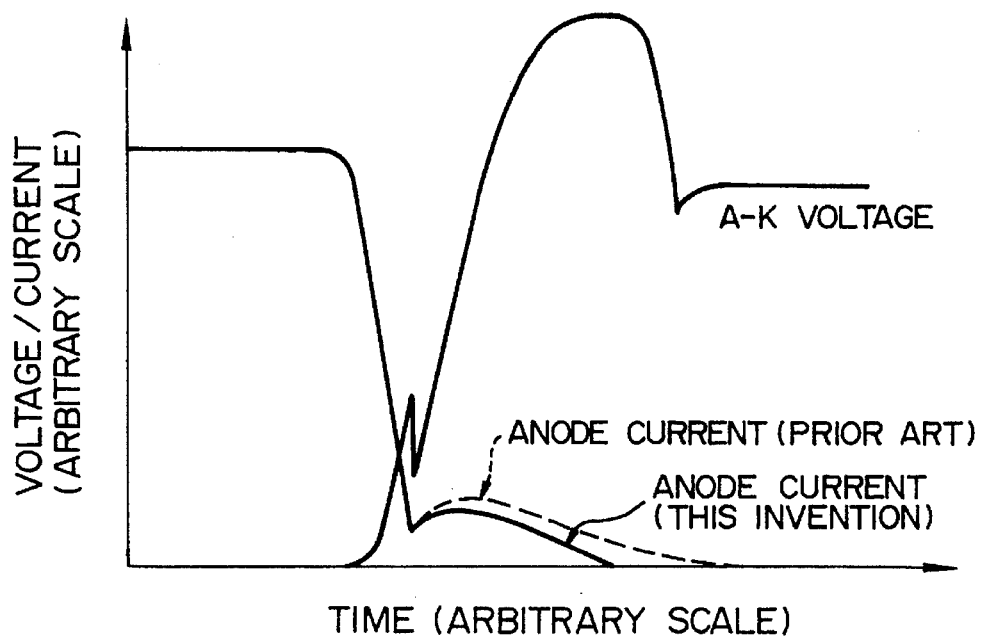
Figure 35:
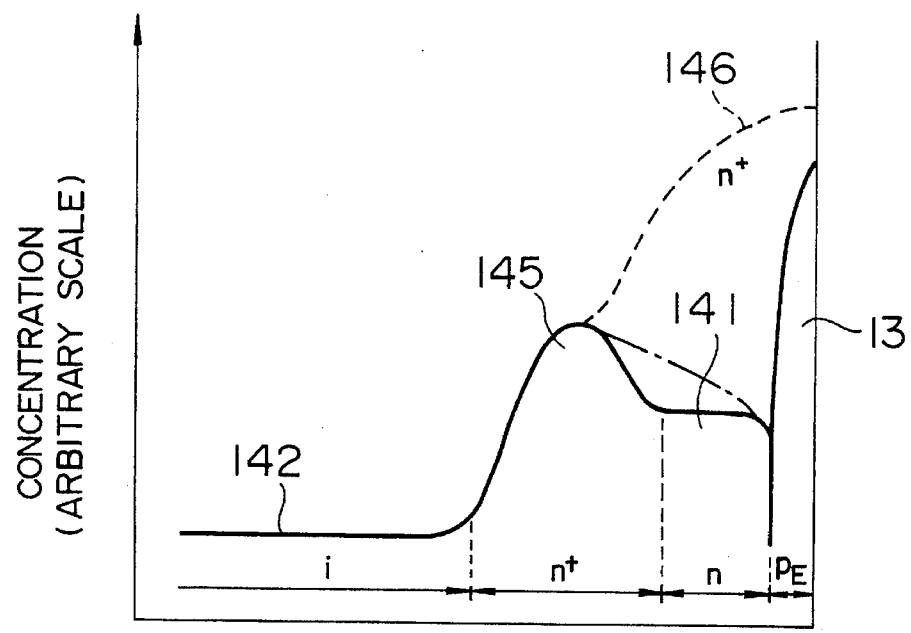
Figure 36:
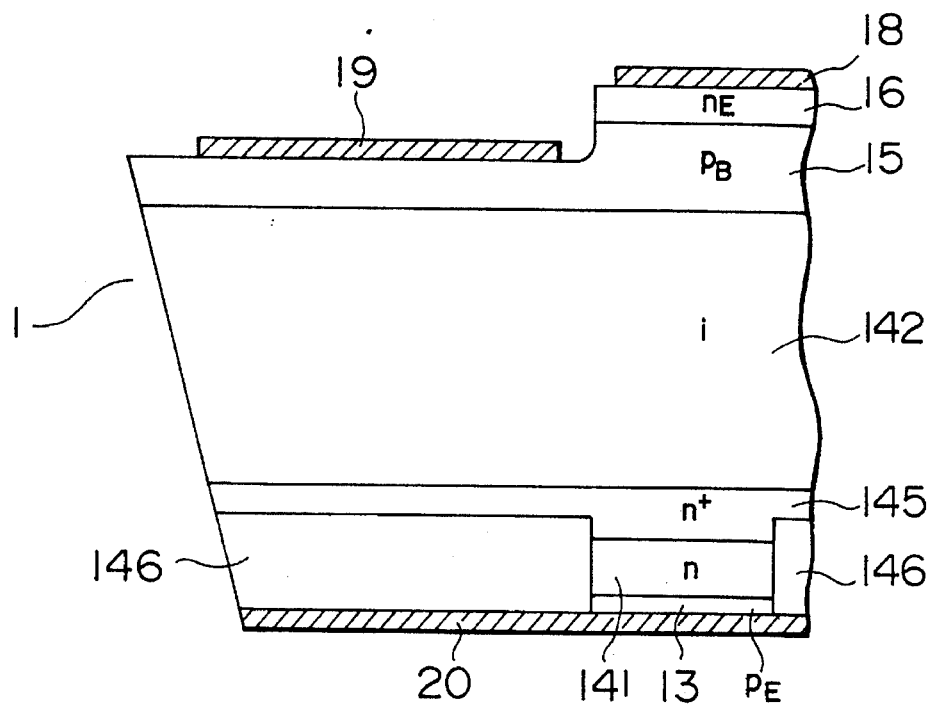
Figure 37:
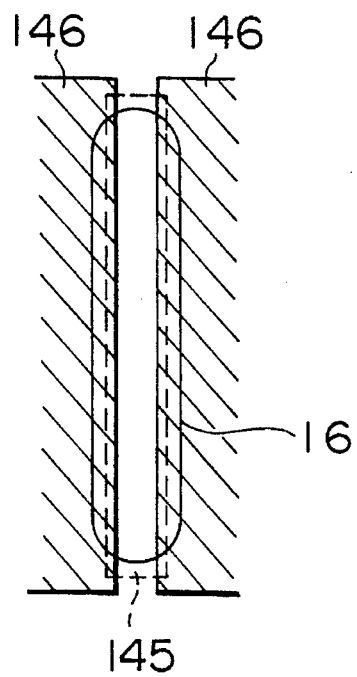
Figure 38:
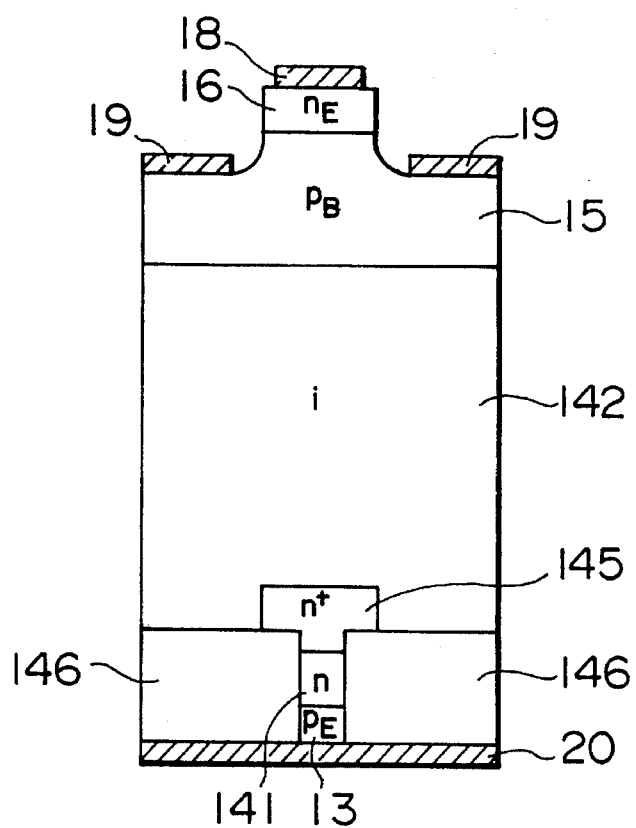
Figure 39:
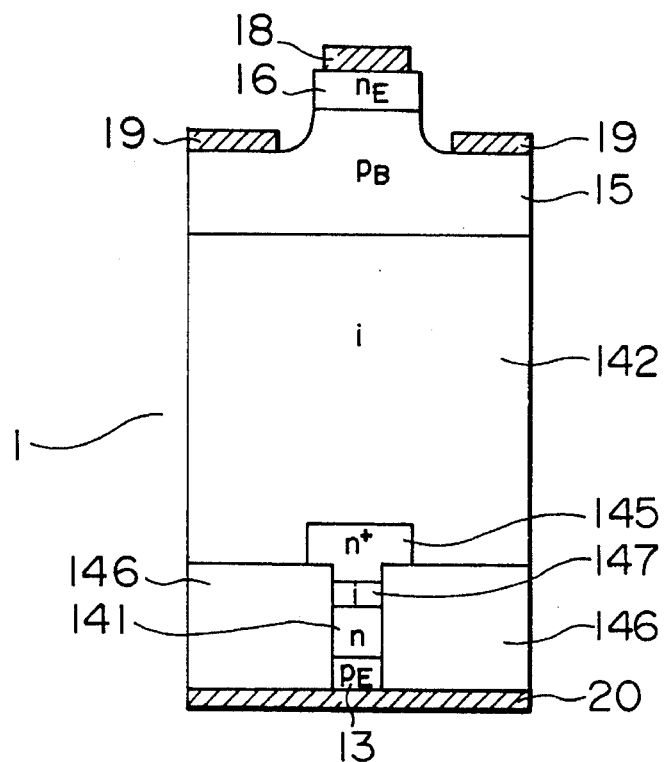
Figure 40:
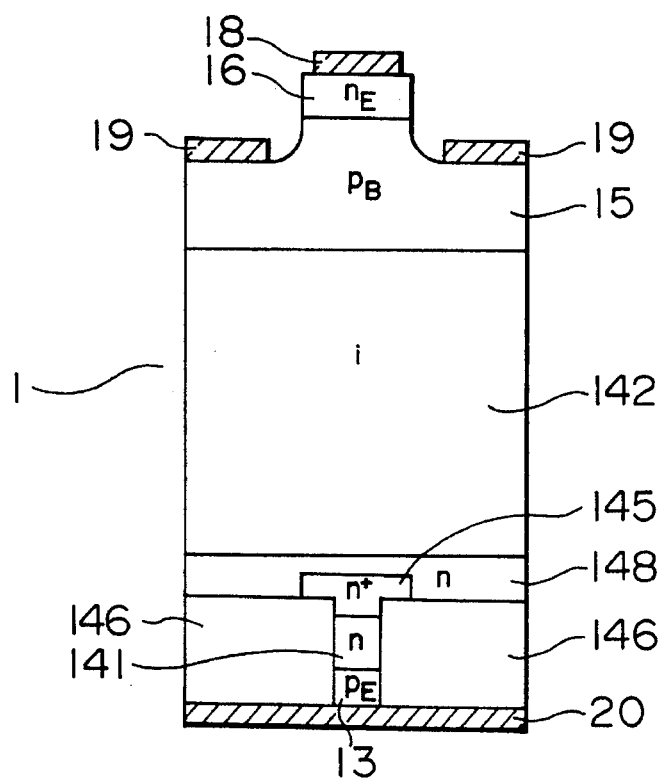
Figure 41:
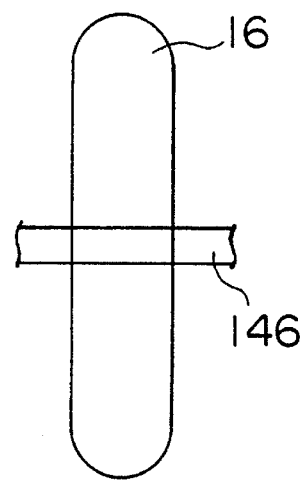
Figure 42:
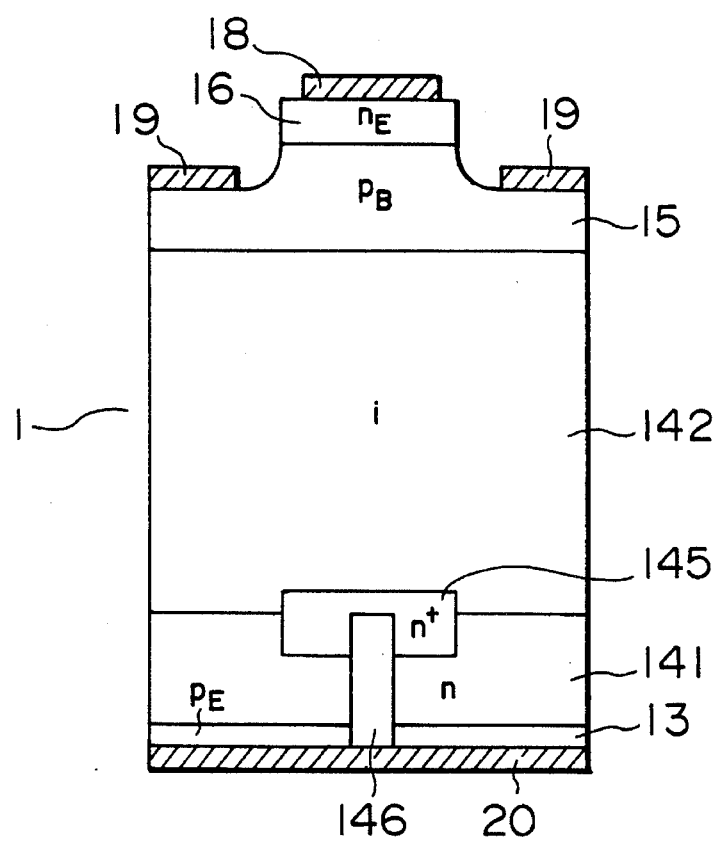
Figure 43:
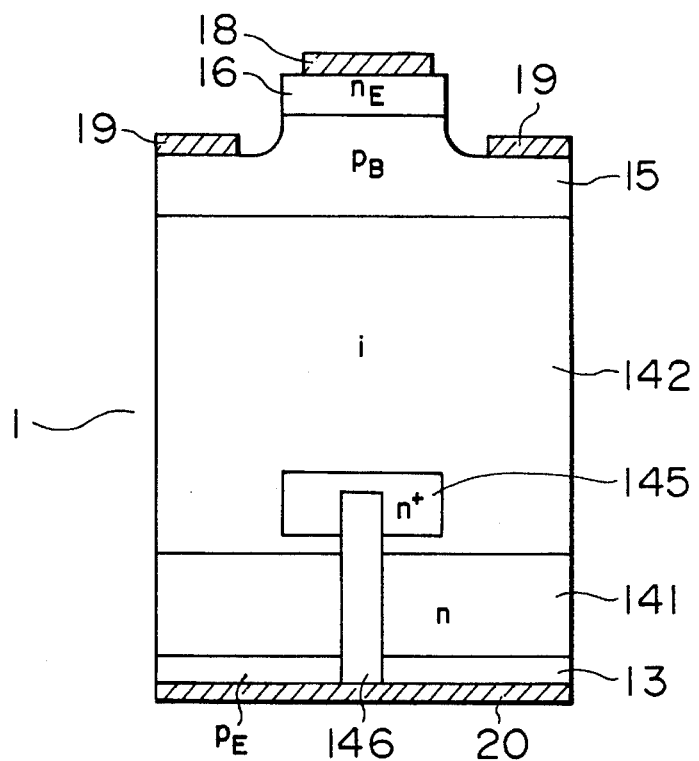
Figure 44:
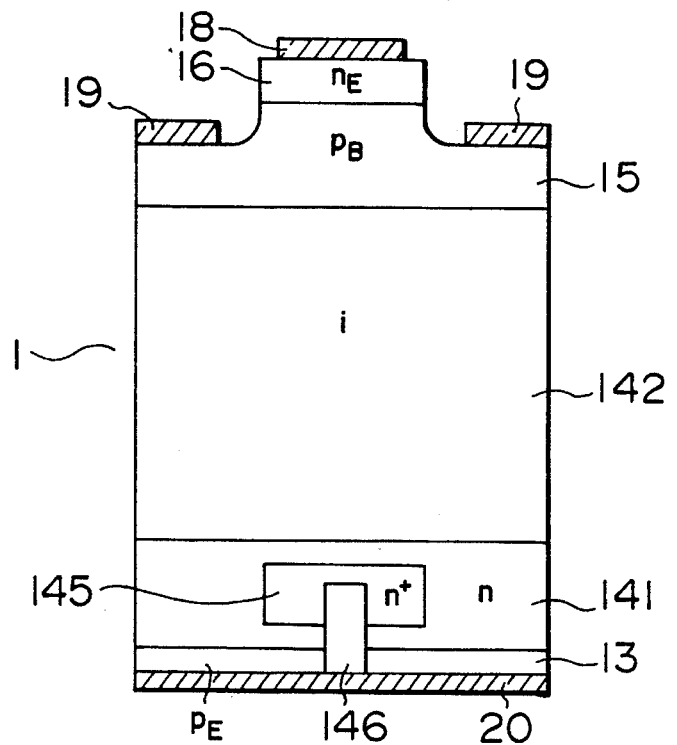

A—A of FIG. 10;

FIG. 12 is a schematic sectional view taken along a line B—B of FIG. 10;

FIG. 13 is a plan view showing an improvement of the GTO according to the embodiment of the present invention shown in FIG. 8;

FIG. 14 is a schematic sectional view taken along a line C—C of FIG. 13;

FIG. 15 is a plan view showing another improvement of the GTO according to the embodiment of the present invention shown in FIG. 8;

FIG. 16 is a schematic sectional view taken along a line D—D of FIG. 15;

FIG. 17 is a schematic sectional view taken along a line E—E of FIG. 15;

FIG. 18 is a planar pattern diagram showing a quadrant of a GTO according to the present invention when viewed from a cathode side;

FIG. 19 is an enlarged view of α, β and γ of FIG. 18;

FIG. 20 is a schematic sectional view taken along a line F—F of FIG. 18;

FIG. 21 is an impurity concentration distribution diagram taken along a line G—G of FIG. 20;

FIG. 22 is a schematic sectional view showing a GTO according to still another embodiment of the present invention;

FIG. 23 is an impurity concentration distribution diagram taken along lines H—H', I—I' and J—J' of FIG. 22;

FIG. 24 is a schematic sectional view showing a GTO according to still another embodiment of the present invention;

FIG. 25 is a schematic sectional view showing a GTO according to still another embodiment of the present invention;

FIG. 26 is a planar pattern diagram showing a quadrant of a GTO according to the present invention when viewed from a cathode side;

FIG. 27 is a schematic sectional view taken along a line K—K' of FIG. 26;

FIG. 28 is a planar pattern diagram showing a quadrant of a GTO according to the present invention when viewed from a cathode side;

FIG. 29 is a planar pattern diagram showing a trisectional circle of a GTO according to the present invention when viewed from a cathode side;

FIG. 30 is a schematic circuit diagram showing an inverter using the GTO according to the present invention;

FIG. 31 is a circuit diagram showing a series circuit of GTOs according to the present invention;

FIG. 32 is a schematic sectional view showing a GTO according to still another embodiment of the present invention;

FIG. 33 is an impurity concentration distribution diagram of the GTO shown in FIG. 32;

FIG. 34 is a turn-OFF waveform diagram of the GTO shown in FIG. 32;

FIG. 35 is an impurity concentration distribution diagram of a GTO according to still another embodiment of the present invention;

FIG. 36 is a schematic sectional view showing a GTO according to still another embodiment of the present invention;

FIG. 37 is a planar pattern diagram showing a GTO according to still another embodiment of the present invention;

FIG. 38 is a longitudinal sectional view of the GTO shown in FIG. 37;

FIG. 39 is a schematic-sectional view showing a modified embodiment of FIG. 37;

FIG. 40 is a schematic sectional view showing still another modified embodiment of FIG. 37;

FIG. 41 is a planar pattern diagram showing a GTO according to still another embodiment of the present invention;

FIG. 42 is a longitudinal sectional view of the GTO shown in FIG. 41;

FIG. 43 is a schematic sectional view showing a modified embodiment of FIG. 42; and FIG. 44 is a schematic sectional view showing still another modified embodiment of FIG. 42.

DESCRIPTION OF THE PREFERRED EMBODIMENTS

Hereinafter, some preferred embodiments of the present invention will be described with reference to the accompanying drawings.

Figure 1:
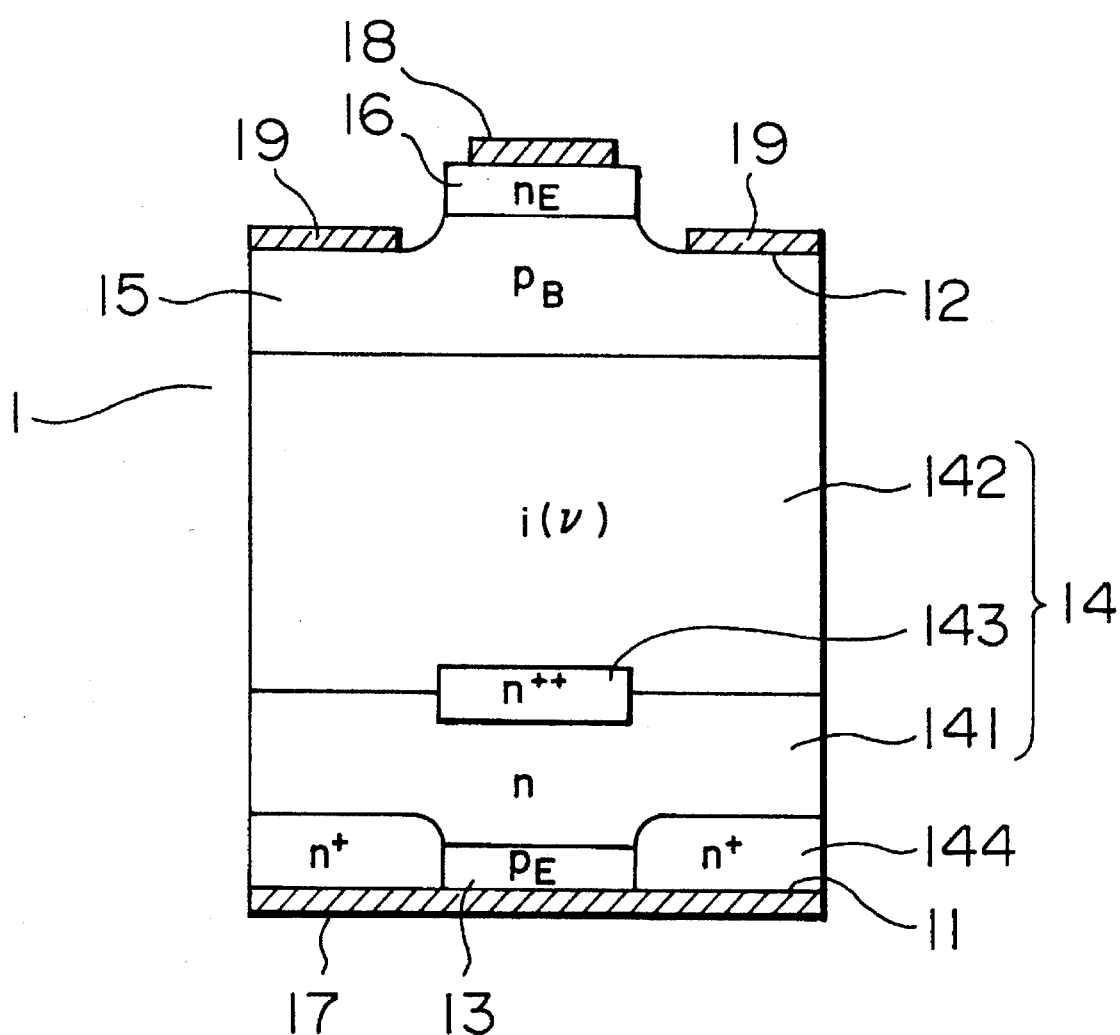
FIG. 1 is a schematic sectional view showing a GTO according to an embodiment of the present invention.

FIG. 1 is a schematic sectional view of a unit GTO according to an embodiment of the present invention. Practically, a large number of unit GTOs are juxtaposed inside a semiconductor substrate. In the drawing, reference numeral 1 denotes a semiconductor substrate having a pair of main planes 11 and 12, 13 is a p conductivity type emitter layer (p-emitter layer) adjacent to one 11 of the main planes, 14 is an n conductivity type base layer (n-base layer) adjacent to one 11 of the main planes and to the p-emitter layer 13, 15 is a p conductivity type base layer (p-base layer) adjacent to the n-base layer 14 and to the other 12 of the main planes, and 16 is an n conductivity type emitter layer (n-emitter layer) adjacent to the p-base layer and to the other 12 of the main planes. The n-base layer 14 comprises a first layer portion 141 adjacent to the p-emitter layer 13, a second layer portion 142 adjacent to the p-base layer 15 and to the first layer portion 141 and having a lower impurity concentration than the first layer portion 141, a third layer portion 143 positioned at the boundary (or interface) between the first and second layer portions 141 and 142 and having a higher impurity concentration than the first and second layer portions 141 and 142, and a fourth layer portion 144 adjacent to one 11 of the main planes, to the first layer portion 141 and to the emitter layer 13, and having a higher impurity concentration than the first layer portion 141. The third layer portion 143 is formed locally at the boundary between the first and second layer portions 141 and 142 in such a fashion that when the third layer portion 143 is projected on one of the main planes (e.g., 11), it overlaps with the p-emitter layer 13 and with the n-emitter layer 16 and moreover, is in parallel with the main plane 11. Reference numeral 17 denotes a main electrode on an anode side, which comes into ohmic contact with the p-emitter layer 13 and with the fourth layer portion 144 of the n-base layer 14 on one 11 of the main planes. Reference numeral 18 denotes a main electrode on a cathode side, which comes into ohmic contact with the n-emitter layer 16 on the other main plane 12, and reference numeral 19 denotes a gate electrode coming into ohmic contact with the p-base layer 15 which is exposed around the n-emitter layer 16 when the other main plane 12 is etched down, for example.

In the GTO having the structure described above, the positive holes injected from the p-emitter layer 13 into the first layer portion 141 under the steady ON state are divided into those positive holes which pass inside the n-base layer 14 in such a manner as to avoid the third layer portion 143, and those positive holes which are injected into the third layer portion 143. The positive holes injected into the third layer portion 143 re-couple with the electrons in the third layer portion 143 and substantially vanish. The positive holes passing inside the n-base layer 14 in such a manner as to avoid the third layer-portion 143 reach the n-emitter layer 16. When the third layer portion 143 is structured so that when it is projected on one of the main planes (e.g., main plane 11), the third layer portion 143 overlaps with the p-emitter layer 13 and the n-emitter layer 16 as shown in FIG. 1, the quantity of the positive holes passing inside the n-base layer 14 in such a manner as to avoid the third layer portion 143 can be reduced to a considerable extent. Accordingly, the quantity of the positive holes reaching the p-base layer 15 immediately below the central portion of the n-emitter layer 16 becomes smaller to a considerable extent than when the third layer portion 143 does not exist, and current concentration at the central portion of the n-emitter layer 16 during turn-OFF of the GTO can be mitigated (i.e. reduced, to a considerable extent. In this case, since the number of positive holes injected from the p-emitter layer 13 under the steady ON state is sufficiently great, the injected positive holes pass without sufficient recoupling and the mitigation effect of current concentration drops at the time of turn-OFF if the impurity concentration of the third layer portion 143 is lower than that of the p-emitter layer 13. Preferably, therefore, the impurity concentration of the third layer portion 143 is higher than that of the p-emitter layers. In practical design of GTOs, the degree of overlap between the third layer portion 143 and the p-emitter layer 13 as well as the n-emitter layer 16 is adjusted appropriately to obtain an optimum structure in consideration of a desired specification.

In FIG. 1, the third layer portion 143 may be in the form of a semi-insulating layer or an insulating layer. In such a case, re-coupling of the positive holes by the third layer portion 143 cannot be expected, but the function of changing the travelling path of the positive holes can still be satisfactorily effected. Accordingly, current concentration at the central portion of the n-emitter layer 16 at the time of turn-OFF can be mitigated to a considerable extent.

Figure 2A:
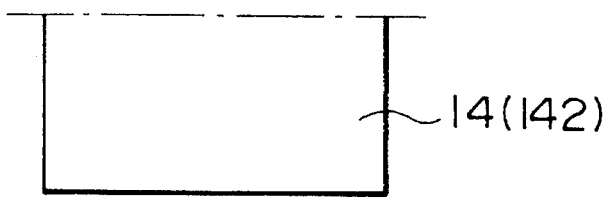
FIGS. 2A–2E are a schematic sectional view showing step-wise a fabrication process of the GTO shown in FIG. 1.
Figure 2B:
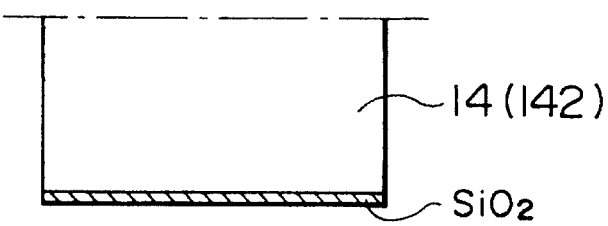
Figure 2C:
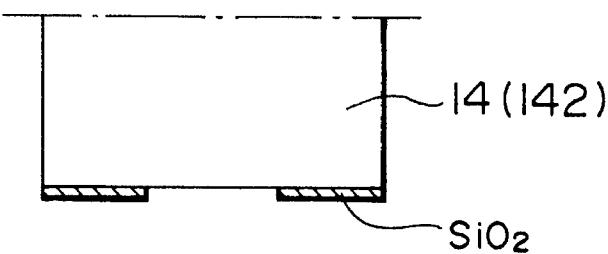
Figure 2D:
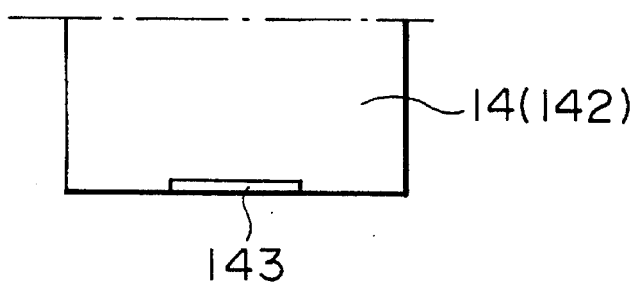
Figure 2E:
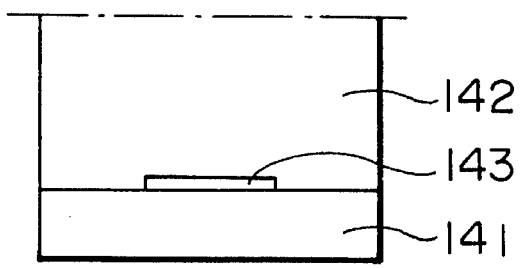

FIGS. 2A–2E are a sectional view showing step-wise an example of a fabrication process of the n-base layer 14 of the GTO shown in FIG. 1. First of all, an n-type silicon substrate having high specific resistance (low impurity concentration) is prepared (FIG. 2A), and then a thermal silicon dioxide film $SiO_2$ is formed on the surface of this n-type silicon substrate 14 (FIG. 2B). A window is formed by etching the thermal silicon dioxide film $SiO_2$ by a known technique (FIG. 2C), and an n-type impurity such as phosphorus is diffused so as to form the third layer portion 143 (FIG. 2D). Next, the first layer portion 141 is grown by epitaxy on the plane of the n-type silicon substrate 14 on which the third layer portion 143 is formed, and in this way, the n-base layer 14 is completed (FIG. 2E). The third layer portion 143 can be formed by implantation of P or As ions, too. Thereafter, the p-base layer 15 and the p-emitter layer 13 are formed on the exposed surface of the n-type silicon substrate 14 and on the first layer portion 141 by impurity diffusion. Next, the n-emitter layer 16 and the fourth layer portion 144 are formed on the p-base layer 15 and the p-emitter layer 13 by impurity diffusion. The n-emitter layer 16 is then removed selectively, and the electrodes are formed. In this way, the GTO is completed. When a semi-insulating layer or an insulating layer is to be formed, on the other hand, it can be formed by ion implantation of oxygen or nitrogen ions in a high concentration in place of the n-type impurity, and then effecting annealing. When the dose of implantation of oxygen or nitrogen is great, $SiO_2$ or $Si_3N_4$ is formed as the insulating layer, and when the dose is small, the semi-insulating layer is formed. The third layer portion 143 can be formed by subjecting the surface of the substrate 14 to ultra-mirror finish and then bonding directly a silicon wafer which is to serve as the first layer portion 141. The substrate 14 and the silicon wafer serving as the first layer portion 141 can be bonded directly by dipping them into a solution such as aqua regia to render their surfaces hydrophilic, putting them one upon another and heating them to about 1,000° C.

Figure 3:
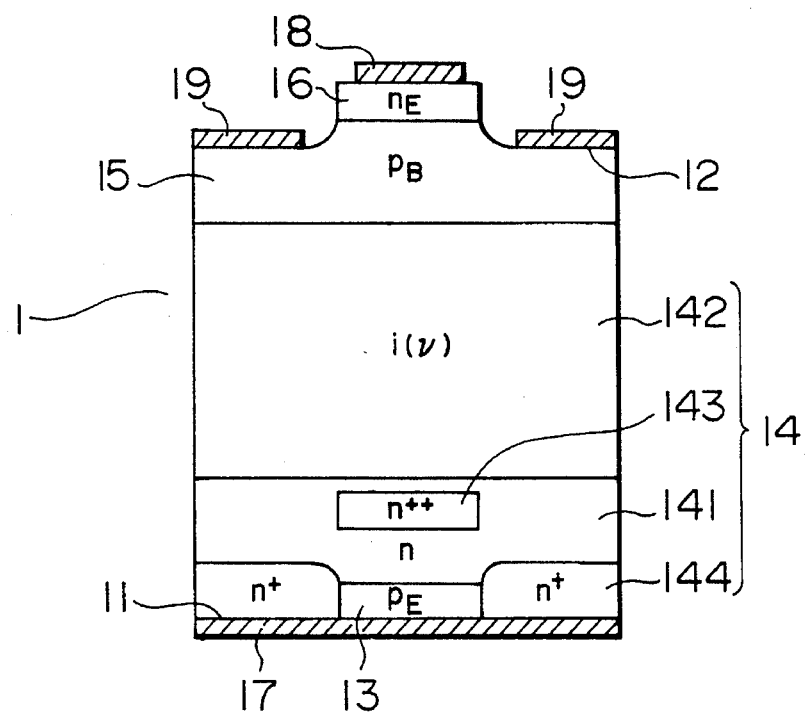
FIG. 3 is a schematic sectional view showing a GTO according to another embodiment of the present invention.

FIG. 3 shows a GTO according to another embodiment of the present invention. This GTO is different from the GTO shown in FIG. 1 in that the third layer portion 143 is formed inside the first layer portion 141. This structure is much more difficult to fabricate than that of the embodiment shown in FIG. 1. Nonetheless, since the third layer portion 143 is disposed in the proximity of the p-emitter layer 13, the positive holes injected from the p-emitter layer 13 into the n-base layer 14 can be recoupled (i.e., recombined with electrons) more quickly and efficiently, and a tail current can be reduced much more greatly than in the embodiment shown in FIG. 1. Accordingly, a GTO having a higher turn-OFF speed can be obtained.

Figure 4:
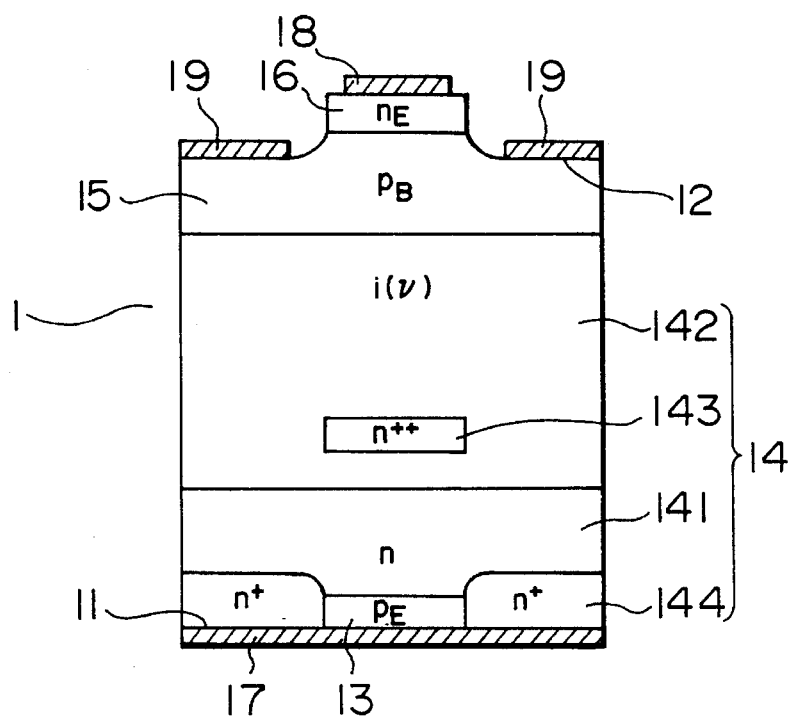
FIG. 4 is a schematic sectional view showing a GTO according to still another embodiment of the present invention.

FIG. 4 shows a GTO according to still another embodiment of the present invention. This GTO is different from the GTO shown in FIG. 1 in that the third layer portion 143 is formed inside the second layer portion 142. This structure is much more difficult to fabricate than that of the embodiment shown in FIG. 1. However, since the third layer portion 143 is disposed in the proximity of the n-emitter layer 16, concentration of the positive holes on the portion immediately below the n-emitter layer 16 can be mitigated more greatly than in the embodiment shown in FIG. 1.

Figure 5:
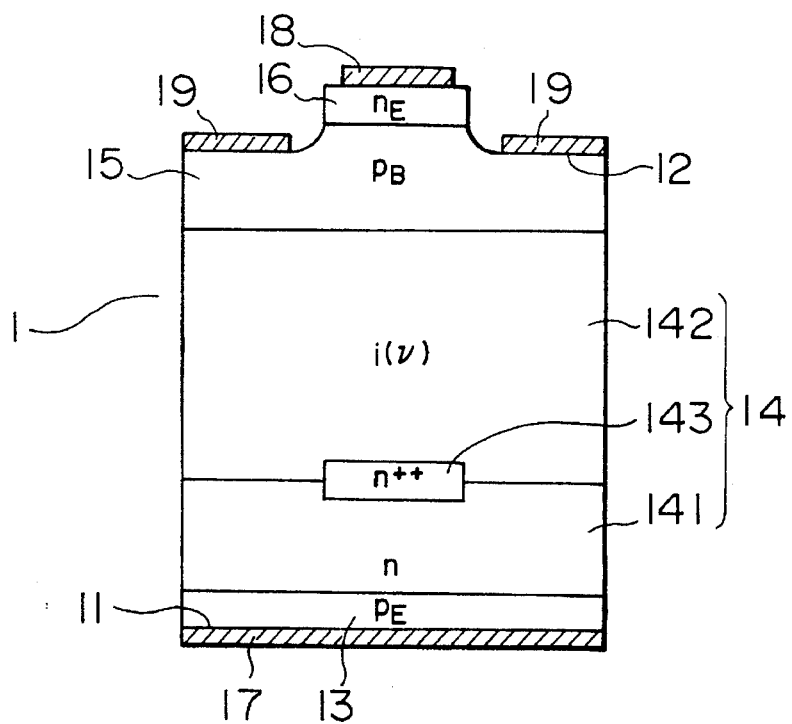
FIG. 5 is a schematic sectional view showing a GTO according to still another embodiment of the present invention.

FIG. 5 shows a GTO according to still another embodiment of the present invention. This GTO is different from the GTO shown in FIG. 1 in that the anode side has a non-short-circuit structure by removing the fourth layer portion 144. In this case, too, the travelling path of the positive holes can be changed by the third layer portion 143. Consequently, current mitigation at the central portion of the n-emitter layer 16 can be effected to a considerable extent, and current concentration at the time of turn-OFF can be mitigated in the same way as the structure shown in FIG. 1. Unlike the GTO shown in FIG. 1, the GTO of this kind has a high withstand voltage in a reverse direction, too, and the GTO can be adapted to the application where a high withstand voltage is a requisite in both directions.

Figure 6:
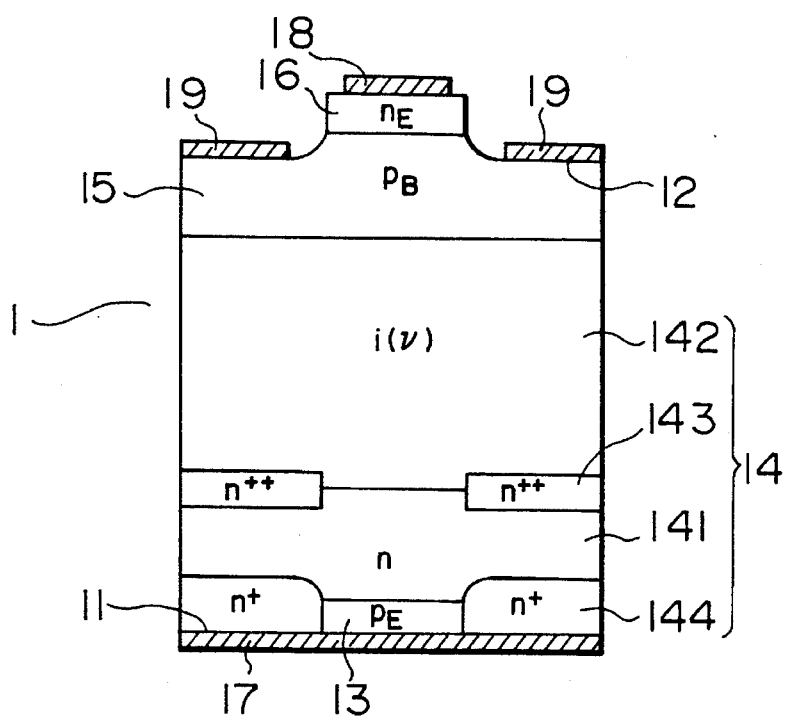
FIG. 6 is a schematic sectional view showing a GTO according to still another embodiment of the present invention.

FIG. 6 shows a GTO according to sill another embodiment of the present invention. This GTO is different from the GTO shown in FIG. 1 in that the position of the third layer portion 143 is different. In other words, the third layer portion 143 is formed in such a fashion that when it is projected on one of the main planes (e.g., main plane 11), the third layer portion 143 does not overlap with the p-emitter layer 13 and with the n-emitter layer 16. In other words, the third layer portion 143 is disposed to overlap with an anode short-circuit portion of the n-base layer 14. According to such a structure, the carriers which remain at portions spaced apart from the anode short-circuit portion of the n-base layer 14 can be discharged efficiently from the anode short-circuit portion of the n-base layer 14 to the electrode side at the time of turn-OFF; hence, the tail current can be reduced. In the structure shown in FIG. 6, too, the third layer portion 143 can be formed inside the first layer portion 141 or the second layer portion 142 in the same way as in the structures shown in FIGS. 3 and 4, respectively, and the tail current at the time of turn-OFF can be reduced.

Figure 7:
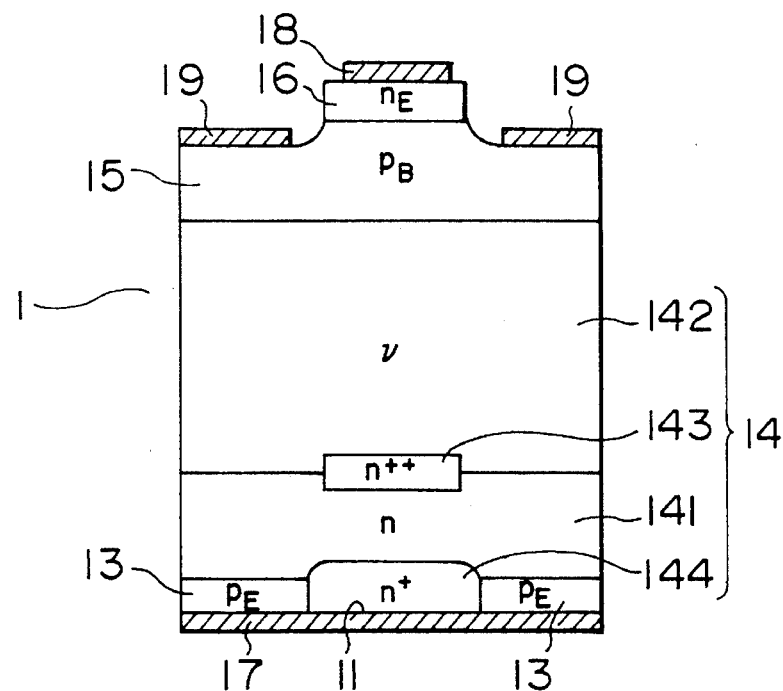
FIG. 7 is a schematic sectional view showing a GTO according to still another embodiment of the present invention.

FIG. 7 shows a GTO according to still another embodiment of the present invention. This GTO is different from the GTO shown in FIG. 1 in the position of the fourth layer portion 144. In other words, the fourth layer portion 144 is formed in such a fashion that when it is projected on one of the main planes 11, the fourth layer portion 144 overlaps with the n-emitter layer 16 and with the third layer portion 143, or in other words, in such a fashion that the third layer portion 143 and the anode short-circuit portion of the n-base layer 14 exist immediately below the n-emitter layer 16. This structure can further reduce the positive hole density and the electron density immediately below the n-emitter layer 16, so that the tail current at the time of turn-OFF can be reduced and current concentration can be mitigated. In FIG. 7, too, the third layer portion 143 can be formed inside the first layer portion 141 or inside the second layer portion 142 in the same way as in FIGS. 3 and 4, respectively, and the tail current at the time of turn-OFF can be reduced.

FIG. 8 shows a GTO according to still another embodiment of the present invention. This GTO is different from the GTO shown in FIG. 1 in that a fifth layer portion 145 having a lower impurity concentration and a smaller thickness than the third layer portion 143 is formed at the boundary between the first layer portion 141 and the second layer portion 142. According to this structure, since the first layer portion 141 and the second layer portion 142 are separated by the thin fifth layer portion 145 having a higher impurity concentration than these first and second layer portions 141 and 142, a depletion layer, which is formed by a p-n junction between the n-base layer 14 and the p-base layer 15, is reversely biased, can be prevented in advance from reaching the p-emitter layer 13, and this structure contributes to the accomplishment of a higher withstand voltage of the GTO. This effect is remarkable particularly when the first layer portion 141 is grown by epitaxial growth.

In the embodiment shown in FIG. 8, the third layer portion 143 and the fifth layer portion 145 are formed inside the same plane, but their positions in the thick-wise direction are not limited to the same plane. They can be formed in separate layer portions, respectively, or can be formed on different planes inside the same layer portion.

Figure 9:
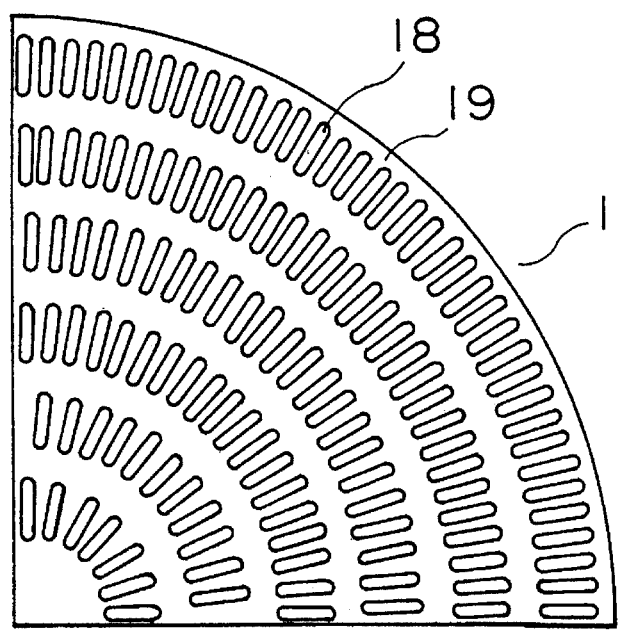
FIG. 9 is a planar pattern diagram showing a quadrant of a GTO according to the present invention when viewed from a cathode side.

FIG. 9 shows an example of a quadrant planar pattern of the GTOs according to the present invention shown in FIGS. 1 to 8 when they are viewed from the cathode side. As is obvious from this drawing, the n-emitter layers 16 have a stripe shape and are so arranged radially as to describe multiple concentric circles (as can be judged from the main electrodes 18 having substantially the same shape as the n-emitter layer 16 and disposed on the n-emitter layer 16 on the cathode side).

Figure 11:
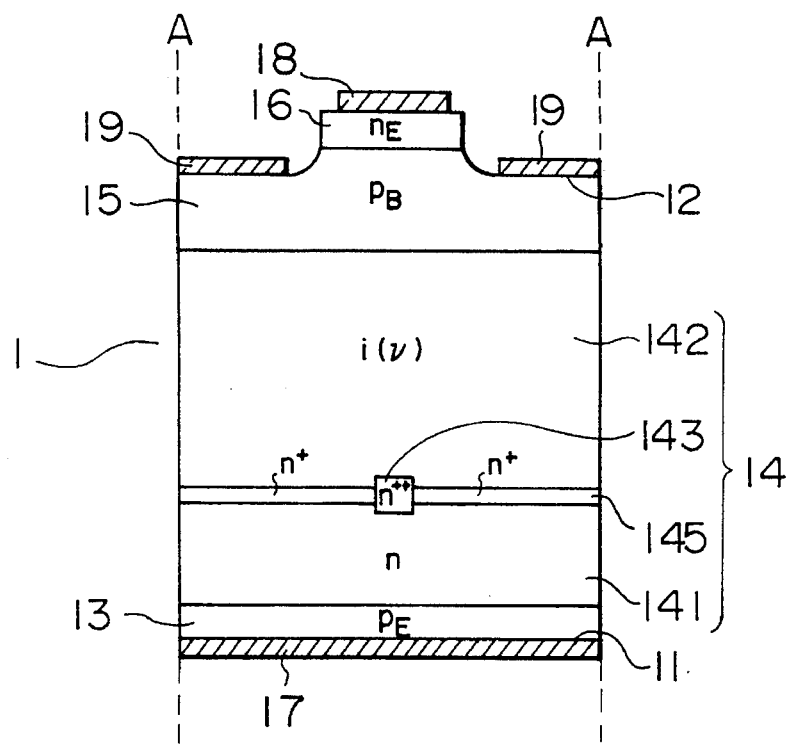
FIG. 11 is a schematic sectional view taken along a line

Next, still another embodiment of the present invention which can reduce the tail current more greatly than the embodiment shown in FIG. 5 will be explained with reference to FIGS. 10 to 12. FIG. 10 is a plan view of this embodiment, and FIGS. 11 and 12 are sectional views taken along lines A—A and B—B of FIG. 10, respectively. This GTO is different from the GTO shown in FIG. 5 in that the anode short-circuit portions are so formed on both sides of the n-emitter layer 16 as not to overlap with the latter when the n-emitter layer 16 is projected on one 11 of the main planes, and that the third layer portion 143 is so formed as to overlap with both of the p-emitter layer 13 and the anode short-circuit portion of the n-base layer 14 when the third layer portion 143 is projected on one 11 of the main planes. According to this structure, the carriers remaining inside the second layer portion 142 of the n-base layer 14 can be discharged quickly at the time of turn-OFF, and the carriers remaining inside the first layer portion 141 opposing the central portion of the n-emitter layer 16 can be discharged without increasing the anode short-circuit portion of the n-base layer 14.

FIGS. 13 and 14 are a plan view and a sectional view showing an example of a substrate end surface structure of the GTO according to the present invention, respectively. This structure is different from the GTO shown in FIG. 8 in that the third layer portion 143 is formed on an exposed end surface of the substrate 1, too. The anode short-circuit portion of the n-base layer 14, too, is so formed as to be exposed on the end surface of the substrate 1 and to overlap with the third layer portion 143. Besides the effect brought forth by the GTO shown in FIG. 8, this structure provides the effect of preventing the drop of the withstand voltage at the end surface portion of the substrate 1.

FIGS. 15 to 16 are a plan view and sectional views showing an example of the improvement of the GTO of the present invention shown in FIG. 8, respectively. This GTO is different from the GTO shown in FIG. 8 in that the fourth layer portion 144 is disposed at the position where it does not overlap with the n-emitter layer 16 and at the position where it crosses the n-emitter layer 16 at the center in the longitudinal direction. According to this structure, the quantity of the positive holes reaching the p-base layer 15 immediately below the central portion of the n-emitter layer 16 decreases, and current concentration at the central portion of the n-emitter layer 16 at the time of turn-OFF can be mitigated in comparison with the GTO shown in FIG. 8.

FIG. 18 is a planar pattern diagram of the GTO according to another embodiment of the present invention when it is viewed from the cathode side. The drawing shows one-quarter of a circular GTO. A plurality of thinly elongated n-emitter layers 16 are disposed radially in a ten-fold ring on a circular semiconductor substrate 1, and a p-base layer 15 exposed near the n-emitter layer 16 is provided with a gate electrode, not shown in the drawing. FIG. 19 sequentially shows, in magnification, unit devices ($\alpha$), ($\beta$) and ($\gamma$) of the first, fifth and tenth rings from the take-out gate electrode shown in FIG. 18 in order to explain the present invention. In the drawing, the third layer portions 143 of unit devices (unit GTO devices) ($\alpha$), ($\beta$) and ($\gamma$) corresponding to three differently distanced unit devices from the centrally located take-out gate electrode 191, have lengths which are L1, L2 and L3 and widths which are W1, W2 and W3, respectively. FIG. 20 is a schematic sectional view of ($\alpha$), ($\beta$) and ($\gamma$) taken along the section F—F' of FIG. 18. The take-out gate electrode 191 is positioned at the center of the circular semiconductor substrate. As can be seen from FIGS. 18, 19 and 20, the length and width of the third layer portion associated with each n-emitter layer 16 or unit GTO device are so set as to satisfy the following relation, namely that the length and width of each third layer portion n-base 143 are determined as a function of the relative distances the third layer portions (and therefore the corresponding unit device) are spaced apart from the take-out gate electrode. In the example of FIG. 20, the following relationship exists:

length of third layer portion: $L1 < L2 < L3$;

width of third layer portion: $W1 < W2 < W3$.

In other words, the area of the third layer portion of (α), which is the closest to the take-out gate electrode, is the smallest and the area of the third layer portion of (γ), which is spaced furthest away from the gate electrode is the greatest.

Next, the operation of this embodiment will be explained. In a large capacity GTO, a large capacity is attained by disposing a plurality of unit devices (or plurality of unit GTO devices) on a circular semiconductor substrate as shown in FIG. 18. As the capacity of the GTO becomes greater, however, the number of unit devices (or unit GTO devices) must be increased, and the unit devices must be disposed even at positions spaced apart from the take-out gate electrode. As a result, a voltage applied between an n-emitter and a p-base becomes smaller in those ones of the unit devices which are spaced apart relatively further from the take-out gate electrode because gate electrode resistance associated therewith is relatively greater, so that the turn-OFF time is likely to be greater. Turn-OFF is effected when the positive holes as excessive carriers in the n-base layer are swept out from the gate electrode. However, in those ones of the unit devices which are more distantly spaced apart from the take-out gate electrode, a voltage applied between the n-emitter layer and the p-base layer is smaller than in the other ones of unit devices, located relatively closer to the gate electrode. As a result, therefore, and a longer time is necessary for sweeping out the same number of positive holes in those unit devices located further away from the take-out gate electrode. If any variance of the turn-OFF time exists between the unit devices inside the same pellet in a large capacity GTO, therefore, a current is more likely to concentrate on the unit devices having a longer turn-OFF time.

As to turn-OFF inside a given unit device, on the other hand, turn-OFF is the slowest at the central portion of the n-emitter layer which is spaced apart most greatly from the gate electrode thereof and which has a large lateral direction resistance of the p-base layer (hereinafter called "RPB"). Therefore, the current is likely to concentrate on the central portion of the n-emitter layer. For these reasons, to simultaneously complete the turn-OFF operation in all the unit devices without local current concentration, it is necessary to decrease the number of positive holes of the n-base layer under a steady ON state in those ones of the unit devices which are relatively further spaced apart from the gate electrode, and to mitigate the current concentration on the central portion of the n-emitter layer. In the structure shown in FIGS. 18, 19 and 20, the number of positive holes in the n-base layer can be decreased by forming the third layer portions having a high impurity concentration in such a manner as to contain projected central portions of the n-emitter layers when they are projected, and to sequentially increase their areas as the distance of the corresponding unit devices is increased from the take-out gate electrode. Furthermore, because the positive hole density decreases immediately below the central portion of the n-emitter layer associated with each unit device, current concentration on the central portion of the n-emitter layer can be mitigated at the time of turn-OFF. Since the positive holes concentrate on the peripheral portion of the n-emitter layer, the RPB becomes smaller and sweep-out of the positive holes becomes easier, so that the turn-OFF time can be reduced. As a result, turn-OFF can be made uniform throughout the pellet as a whole, and a large current can be cut off.

FIG. 21 schematically shows the impurity concentration distribution at the section G—G' of FIG. 20. In the drawing, the impurity concentration distribution is plotted on the abscissa and the depth is plotted on the ordinate.

FIG. 22 is a schematic sectional view of still another embodiment of the present invention, wherein the impurity concentration of the third layer portion is so formed as to progressively increase with an increase of its distance thereof from the take-out gate electrode. This drawing shows the unit devices (α), (β) and (γ) when the embodiment is applied to the GTO shown in FIG. 18. FIG. 23 schematically shows the impurity distribution along H—H', I—I' and J—J' of FIG. 22. In the structure shown in FIG. 22, the positive holes injected from the p-emitter layer are divided into those positive holes which enter the third layer portion and those which avoid it. The positive holes entering the third layer portion undergo re-coupling while they pass through the third layer portion and their number decreases. The proportion of this re-coupling is determined in accordance with the impurity concentration of the third layer portion. The number of the positive holes injected from the p-emitter layer is sufficiently great particularly under the steady ON state, and in order to allow almost all the positive holes entering the third layer portion to re-couple, it is more effective to set the impurity concentration of the third layer portion to a level equal to, or higher than, the impurity concentration of the p-emitter layer. However, the impurity concentration of the third layer portion provides the effect of reducing the number of the positive holes passing through the third layer portion at a certain porportion even when it is lower than the impurity concentration of the p-emitter layer. This embodiment is so constituted as to decrease progressively the number of the positive holes with an increasing distance from the take-out gate electrode, and according to this structure, turn-OFF can be made uniform throughout the pellet as a whole and a large current can be cut off.

FIG. 24 is a schematic sectional view of still another embodiment which further improves the embodiment shown in FIGS. 18, 19 and 20, and shows the unit devices (α), (β) and (γ) shown in FIG. 18. In this structure, the relative widths of the p-emitter layer associated with three increasingly distanced unit devices, from the take-out gate electrode, are d1, d2 and d3, and satisfy the following relation:

width of p-emitter layer: d1>d2>d3

In other words, the number of the positive holes injected from the p-emitter layer is so arranged as to progressively decrease. Furthermore, the turn-OFF time can be aligned throughout the pellet as a whole, and a large current can be cut off.

FIG. 25 is a schematic sectional view of still another embodiment which further improves the embodiment shown in FIGS. 18, 19 and 20, and shows the unit devices (α), (β) and (γ) shown in FIG. 18. In this structure, the impurity concentration of the p-emitter layer is so arranged as to progressively decrease in the departing direction from the take-out gate electrode. In other words, the peaks of the impurity concentrations of the p-emitter layers 131, 132 and 133, i.e. NPE1, NPE2 and NPE3, are so arranged as to satisfy the relation NPE1>NPE2>NPE3 namely, the impurity concentration of the p-emitter layer of a respective unit device is decreased as the distance thereof (and also of the corresponding unit device), from the take-out gate electrode is increased. This structure can reduce the density of the positive holes injected sequentially from the p-emitter layers. Therefore, the turn-OFF time can be aligned throughout the pellet as a whole, and a large current can be cut off.

FIG. 26 is a planar pattern diagram of the GTO according to still another embodiment of the present invention when it is viewed from the cathode side, and shows one quarter of the circle. The positions of the third layer portions are also shown in FIG. 26. FIG. 27 is a schematic sectional view of the unit devices (α), (β) and (γ) along a line K—K' of FIG. 26. In this structure, the third layer portions are disposed in the form of rings having ring (e.g., annular rings) widths of W1, W2 and W3, and these widths satisfy the following relation which is based on the relative distances thereof from the take-out gate electrode:

ring width: W1<W2<W3

Injection of the positive holes to the central portion of the n-emitter layer can be further reduced by disposing the third layer portions in the belt form with respect to the unit devices. Accordingly, current concentration on the central portion of the n-emitter layer can be further mitigated.

The foregoing embodiments illustrate the case where the n-emitter layer 16 is the 10-fold ring, but the present invention provides equivalent effects when the number of rings is increased or decreased depending on the current capacity or when the n-emitter layers are arranged in accordance with another rule such as when the n-emitter layers are juxtaposed as shown in FIGS. 28 and 29, for example.

The foregoing embodiments illustrate the case where the take-out gate electrode is disposed at the central portion of the circular semiconductor substrate (the GTO pellet), but the present invention can be applied to other cases such as when the gate electrode is disposed at the outer periphery or at the intermediate periphery in the ring form.

In the foregoing embodiments, the third layer portion is formed inside the unit devices at such a position where current concentration on the central portion of the n-emitter layer does not occur. However, this position is not particularly limited, and the gate electrode can be disposed at any position so long as current concentration on the n-emitter layer can be prevented. For example, in the unit device which is spaced the furthest away from the take-out gate electrode, the third layer portion is disposed on the opposite side to the take-out gate electrode instead of the center of the n-emitter layer.

Though the third layer portions are formed in all the unit devices in this embodiment, they need not always be formed in all the unit devices and similar effects can be obtained, too, when they are formed only at the outer peripheral portions spaced apart from the gate electrode.

Though the present invention controls the injection of the positive holes from the p-emitter layer, similar effects can be obtained when the present invention is applied to an SI thyristor and an MCT.

FIG. 30 is a circuit diagram showing an example of a three-phase inverter using the GTOs according to the present invention. In the circuit diagram, symbols $T_1$ and $T_2$ denote a pair of D.C. terminals connected to a D.C. power source, and symbols $G_1$ and $G_2$, $G_3$ and $G_4$, and $G_5$ and $G_6$ denote the GTOs of the present invention that are connected in series, and the series circuits are juxtaposed with one another between the pair of D.C. terminals $T_1$ and $T_2$ with their polarity in alignment. Symbols $D_1$ to $D_6$ denote diodes for cycling a load current, which are juxtaposed with the GTOs with their polarity being opposite to the polarity of the GTOs, respectively. Symbols $T_3$, $T_4$ and $T_5$ denote A.C. terminals disposed in the same number (three) as the number of the phases of an A.C. output and extended from the junctions of two each GTOs connected in series. When the inverter is structured by the use of the GTOs according to the present invention, the capacity per GTO (withstand voltage× feed current) becomes great. Accordingly, the number of series/parallel connections of the GTOs can be reduced, and reliability and controllability of the inverter can be improved.

Since the withstand voltage of the GTOs is lower than a voltage necessary for a system in large capacity inverters, a plurality of GTO devices must be connected in series so as to constitute the GTOs represented by $G_1$ to $G_6$ in FIG. 30. FIG. 31 shows a definite example of this series connection. In the drawing, symbol LA denotes an anode reactor which suppresses a current rise ratio di/dt when the GTOs are turned ON and suppresses an overcurrent when the GTOs fail to commute, RA is a current limiting resistor of the anode reactor circuit, DA is a cycling diode of the anode reactor circuit, DF is a diode for cycling a load current, DS is a snubber diode, RS is a snubber resistor, CS is a snubber capacitor, and GU is a gate circuit for turning On and OFF the GTOs. Power that the large capacity inverter can handle is determined by the withstand voltage of the semiconductor devices, the large current and the increase in the number of series connection of the devices. A conventional unit inverter capacity constituted by connecting in series four GTOs each having a withstand voltage of 4.5 KV and a controllable current of 3 KA is 8.3 MVA when only one phase of FIG. 30 is used, for example, but the GTO according to the present invention has a withstand voltage of 8 KV and a controllable current of 5 KA. Therefore, when four of these GTOs are connected in series to constitute a unit inverter, the capacity of the inveter becomes 25 MVA, and thus, the capacity can be increased drastically. Furthermore, when four of these unit inverters are used in a quadruple arrangement, a large capacity GTO inverter having a 100 MVA capacity can be accomplished.

The foregoing description explains the GTO of the present invention and the power convertor using the GTOs with reference to the specific embodiments, but the present invention is not particularly limited thereto, that is, the exemplified embodiments and related description can be changed and modified in various ways within the scope thereof.

FIG. 32 is a sectional view showing a GTO according to still another embodiment of the present invention. This embodiment is different from the foregoing embodiments in that the n-base layer 14 includes a fifth layer portion 145 having a higher impurity concentration than the first and second layer portions 141 and 142 and disposed between these layer portions 141 and 142, and a sixth layer portion 146 so disposed as to extend from the fifth layer portion 145 as to penetrate through the first layer portion 141 and the p-emitter layer 13 and to reach the main electrode 17. FIG. 33 shows a distribution (profile) of the impurity concentration of the GTO in this embodiment. As can be seen clearly from the diagram, the impurity concentration of the fifth layer portion 145 has its peak substantially at its center in the thick-wise direction of the layer. According to this embodiment, since the fifth layer portion 145 is formed, it is possible to prevent a spatial depletion layer from coming into contact with the p-emitter layer 13 in the same way as a conventional GTO having a p-n-i-p-n structure, and since the first layer portion 141 having a low impurity concentration is formed, the specific resistance of the n-base layer 14 can be increased as a whole. Furthermore, since a built-in voltage with the p-emitter layer 13 can be reduced, a gate trigger current can be made smaller than that in the conventional GTO having the p-n-i-p-n structure. In addition, since the tip of the sixth layer portion 146 is allowed to come into contact with the fifth layer portion 145, the carriers can be extracted efficiently at the time of turn-OFF, so that the turn-OFF characteristics can be improved.

FIG. 34 comparatively shows the turn-OFF characteristics of the GTO shown in FIG. 32 and the turn-OFF characteristics (dotted line) according to the prior art. It can be understood from the diagram that since the sixth layer portion 146 does not exist in the prior art, the period in which the tail current occurs becomes elongated and, also its peak value becomes greater. In contrast, since the GTO according to the present invention includes the sixth layer portion 146, it can reduce both the tail period and the peak value of the current as represented by the characteristics of solid lines, as can be seen clearly from the diagram. Furthermore, because the impurity concentration of the first layer portion 141 is lower than that of the fifth layer portion 145 and is constant, it is possible to obtain a GTO having a low ON voltage and excellent turn-OFF characteristics without requiring an increase of the gate trigger current.

To further make the most of the characteristics of the GTO shown in FIG. 32, the thickness of the p-emitter layer 13 is preferably as small as possible, and to further improve the turn-OFF characteristics as well as trade-off characteristics, the specific resistance is preferably as high as possible. For example, let's consider the case when the p-emitter layer 13 is constituted by diffusing boron (B). In this case, its thickness is preferably below 15 μm such as 5 μm, and its specific resistance is preferably at least $25\Omega$ per $cm^2$.

Next, a modified example of the embodiment shown in FIG. 32 will be explained. The GTO of this modified example can be obtained by reducing the life time of the fifth layer portion 145 and first layer portion 141 without changing the life time of the second layer portion 142 by irradiating protons from the side of the main electrode 17 in the embodiment shown in FIG. 32. Since conventional life time reduction technique reduces the life time of the second layer portion 142, too, it invites a remarkable rise of the ON voltage with the improvement in the turn-OFF characteristics. In contrast, the life time of the n-base layer 14 does not change in this modified embodiment. Accordingly, the rise of the ON voltage hardly occurs even when the turn-OFF characteristics are improved. Since the short-circuit resistance is not reduced, the increase of the gate trigger current is small unlike the case where short-circuit is emphasized. According to this modified example, therefore, mutual trade-off between the turn-OFF loss, the ON voltage and the gate trigger current can be improved remarkably. In addition, since the tip of the sixth layer portion 146 is allowed to come into contact with the fifth layer portion 145 in this embodiment, the turn-OFF characteristics can be further improved.

FIG. 35 shows a distribution of an impurity concentration of a GTO according to still another embodiment of the present invention. The sixth layer portion 146 is formed by diffusing phosphorus (P) from the plane on the side of the main electrode 17, while the fifth layer portion 145 is formed using antimony (Sb) or arsenic (As) as an impurity source. In this instance, the sixth layer portion 146 is formed by thermal diffusion after the fifth layer portion 145 is formed by epitaxy, or the like.

Assuming that the diffusion constant of the impurity source of the fifth layer portion 145 is equal to, or smaller than, the diffusion constant of the impurity source of the sixth layer portion 146, the fifth layer portion will expand beyond the first layer portion 141 as indicated by a dotted line due to a thermal process till the formation of the sixth layer portion 146 or due to a subsequent thermal process. In such a case, the built-in voltage with respect to the p-emitter layer 13 increases and the increase of the gate trigger current occurs.

In contrast, the embodiment shown in FIG. 35 uses P for the impurity source of the sixth layer portion 146 and Sb or As for the impurity source of the fifth layer portion 145. Since the diffusion constants of Sb and As have value less than half of the diffusion constant of P, the fifth layer portion 145 does not expand beyond the first layer portion 141. Even when the thermal process is applied until the tip of the sixth layer portion 146 comes into contact with the fifth layer portion 145, the first layer portion 141, which is clearly separated from the fifth layer portion 145, can be formed as indicated by the solid line in FIG. 35, so that the gate trigger current can be prevented from increasing remarkably.

FIG. 36 is a schematic sectional view showing a GTO according to still another embodiment of the present invention.

The expansion of the spatial charge layer (depletion layer) on the end surface of the semiconductor substrate of the GTO is generally greater than the expansion inside the semiconductor substrate. For this reason, the conventional GTOs employ a bevel structure wherein the end surfaces of the semiconductor substrate are inclined with respect to its main planes, but the expansion of the spatial charge layer is not always suppressed sufficiently.

In the embodiment shown in FIG. 36, therefore, a part of the sixth layer portion 146 comprising a plurality of portions is exposed to each end surface of the semiconductor substrate 1, and the tip of the sixth layer portion comes into complete contact with the fifth layer portion 145 on this end surface.

As a result, the expansion of the spatial charge layer is reliably stopped on the end surface of the semiconductor substrate 1 where the expansion is generally great, without penetrating to the plane on the side of the main electrode 17.

FIGS. 37 and 38 are a planar pattern view and a schematic sectional view of a GTO according to still another embodiment of the present invention. This embodiment is different from the embodiment shown in FIG. 32 in that the first layer portion 141 and the fifth layer portion 145 are formed partially, and the sixth layer portion 136 is formed substantially over the entire surface. The fifth layer portion 145 is formed in such a manner as to contain, or to be contained in a part of, a projected portion of the p-emitter layer 13, on the main plane of the semiconductor substrate 1, by impurity diffusion or ion implantation. Preferably, the impurity concentration of this fifth layer portion 145 is higher than that of the p-emitter layer 13. When the impurity concentration of the p-emitter layer 13 is $10^{19}$ per cubic centimeter, for example, the impurity concentration of the fifth layer portion is approximately $10^{20}$. Since this fifth layer portion 145 exists, the positive holes injected from the p-emitter layer 13 opposing the fifth layer portion 145 into the first layer portion 141 under the steady ON state are quickly injected into the fifth layer portion 145 and vanish upon re-coupling. Accordingly, the quantity of the positive holes reaching the p-base layer 15 immediately below the central portion of the n-emitter layer 16 can be reduced, and the current concentration at the central portion of the n-emitter layer 16 can be mitigated at the time of turn-OFF. However, the number of the positive holes injected from the p-emitter layer 13 is considerably great under the steady ON state. When the impurity concentration of the fifth layer portion 145 is lower than that of the p-emitter layer 13, therefore, the positive holes injected into the fifth layer portion 145 pass without recoupling, so that the effect of mitigating the current concentration at the time of turn-OFF becomes lower.

Accordingly, this embodiment becomes more effective if the impurity concentration of the fifth layer portion is made higher than the impurity concentration of the p-emitter layer 13.

FIG. 39 shows a modified example of the embodiment shown in FIGS. 37 and 38. In this modified example, a seventh layer portion 147 having an impurity concentration substantially equal to that of the second layer portion 142 is formed between the fifth layer portion 145 and the first layer portion 141. In this modified example, too, the current concentration at the time of turn-OFF can be mitigated in the same way as in the embodiment shown in FIG. 38.

FIG. 40 shows another modified example of the embodiment shown in FIGS. 37 and 38. In this modified example, an eighth layer portion 148 is formed in the proximity of the fifth layer portion 145 between the second layer portion 142 and the sixth layer portion 146. This modified example, too, can mitigate the current concentration at the time of turn-OFF in the same way as the embodiment shown in FIG. 38.

FIGS. 41 and 42 are a planar pattern diagram and a schematic sectional view showing a GTO according to still another embodiment of the present invention. In this embodiment, the sixth layer portion 146 is so formed as to cross the n-emitter layer 16 when it is projected on the main plane 12, and the fifth layer portion 145 and the sixth layer portion 146 are formed partially substantially over the entire surface of the first layer portion 141. In this arrangement, this embodiment is different from the other embodiments. This embodiment can further reduce the positive hole density and the current density immediately below the n-emitter layer 16 by the fifth layer portion 145 and by the sixth layer portion 146 coming into contact with the fifth layer portion 145. Accordingly, it can reduce the tail current at the time of turn-OFF and can mitigate the current concentration. In the embodiment shown in FIG. 41, too, it is possible to dispose the fifth layer portion 145 inside the n-base layer 14, or to form it inside the first layer portion 141, in the same way as in the embodiment shown in FIG. 3 and as in the modified example shown in FIGS. 39 and 40. These modified examples are shown in FIGS. 43 and 44, respectively.

As described above in detail, the present invention can mitigate the current concentration on the cathode side at the time of turn-OFF by forming the third layer portion having a high impurity concentration or the semi-insulating layer or the insulating layer inside the n-base layer, and can accomplish a GTO having a remarkably increased breakdown voltage. Since the carriers remaining inside the n-base layer can be discharged quickly, the present invention can also accelerate damping of the tail current. Furthermore, the present invention can accomplish a large capacity power convertor by applying the large capacity GTOs of the invention.

What is claimed is:

1. A gate turn-off thyristor (GTO) comprising a semiconductor body having a pair of main planes at oppositely facing surfaces thereof, and including, between said main planes:

a first emitter layer, having a p-type conductivity, being provided adjacent to one of said main planes in an anode side of said GTO;

a first base layer, having an n-type conductivity, being provided adjacent to said first emitter layer;

a second base layer, having said p-type conductivity, being provided adjacent to said first base layer and to the other of said main planes; and a second emitter layer, having said n-type conductivity, being provided adjacent to said second base layer and to the other of said main planes in a cathode side of said GTO, wherein said first base layer is comprised of a first layer portion provided adjacent to said first emitter layer, a second layer portion provided adjacent to said second base layer and having a lower impurity concentration than said first layer portion, and a third layer portion disposed at a part within said first base layer on a plane in parallel with one of said main planes in such a manner as to be spaced apart from said first emitter layer and from said second base layer but disposed adjacent to at least one of said first and second layer portions, and having a higher impurity concentration than said first and second layer portions, wherein said first emitter layer is in ohmic contact with an anode electrode provided on said one of said main planes of said semiconductor body, wherein said second emitter layer is in ohmic contact with a cathode electrode provided on said other of said main planes of said semiconductor body, and wherein said second base layer is in ohmic contact with a gate electrode provided at said other of said main planes of said semiconductor body.

2. A gate turn-off thyristor (GTO) comprising a semiconductor body having a pair of main planes at oppositely facing surfaces thereof, and including, between said main planes:

a first emitter layer, having a p-type conductivity, being provided adjacent to one of said main planes in an anode side of said GTO;

a first base layer, having an n-type conductivity, being provided adjacent to said first emitter layer;

a second base layer, having said p-type conductivity, being provided adjacent to said first base layer and to the other of said main planes; and a plurality of second emitter layers, having said n-type conductivity, being provided adjacent to said second base layer and to the other of said main planes in a cathode side of said GTO, wherein said first base layer is comprised of a first layer portion adjacent to said first emitter layer, a second layer portion adjacent to said second base layer and having a lower impurity concentration than said first layer portion, and a third layer portion disposed at a part within said first base layer on a plane in parallel with one of said main planes in such a manner as to be spaced apart from said first emitter layer and from said second base layer but disposed adjacent to at least one of said first and second layer portions, and having a higher impurity concentration than said first and second layer portions, wherein said first emitter layer is in ohmic contact with an anode electrode provided on said one of said main planes of said semiconductor body, wherein each of said second emitter layers is in ohmic contact with a cathode electrode corresponding thereto, provided on said other of said main planes of said semiconductor body, and wherein said second base layer is in ohmic contact with a gate electrode, provided at the other of said main planes of said semiconductor body in such a manner as to encompass said plurality of second emitter layers.

3. A gate turn-off thyristor according to claim 2, wherein said third layer portion of said first base layer and said plurality of second emitter layers are so arranged as to overlap with one another when they are projected on one of said main planes.

4. A gate turn-off thyristor (GTO) comprising a semiconductor body having a pair of main planes at oppositely facing surfaces thereof, and including, between said main planes:

a first emitter layer, having a p-type conductivity, being provided adjacent to one of said main planes in an anode side of said GTO;

a first base layer, having an n-type conductivity, being provided adjacent to said first emitter layer and to said one of said main planes;

a second base layer, having said p-type conductivity, being provided adjacent to said first base layer and to the other of said main planes; and a plurality of second emitter layers, having said n-type conductivity, being provided adjacent to said second base layer and to said other of said main planes in a cathode side of said GTO, wherein said first base layer is comprised of a first layer portion adjacent to said first emitter layer and to said one of said main planes, a second layer portion adjacent to said second base layer and having a lower impurity concentration than said first layer portion, and a third layer portion disposed in one of said first and second layer portions or at an interface thereof, within said first base layer, on a plane in parallel with one of said main planes in such a manner as to be spaced apart from said first emitter layer and from said second base layer and having a higher impurity concentration than said first and second layer portions, wherein said first emitter layer is in ohmic contact with an anode electrode provided on said one of said main planes of said semiconductor body, wherein each of said second emitter layers is in ohmic contact with a cathode electrode corresponding thereto, provided on said other of said main planes of said semiconductor body, and wherein said second base layer is in ohmic contact with a gate electrode, provided at said other of said main planes of said semiconductor body in such a manner as to encompass said plurality of second emitter layers.

5. A gate turn-off thyristor according to claim 4, wherein said third layer portion of said first base layer and said plurality of second emitter layers are so arranged as to overlap with one another when they are projected on one of said main planes.

6. A gate turn-off thyristor according to claim 4, wherein said third layer portion of said first base layer and said plurality of second emitter layers are so arranged as to be projected on mutually different planes when they are projected on one of said main planes.

7. A gate turn-off thyristor according to claim 4, wherein said third layer portion of said first base layer and a portion of one of said first and second base layers, which comes into ohmic contact with one of said anode and cathode electrodes, are so arranged as to overlap with each other when they are projected on one of said main planes.

8. A gate turn-off thyristor according to claim 4, wherein said third layer portion of said first base layer and a portion of one of said first and second base layers which comes into ohmic contact with one of said anode and cathode electrodes are so arranged as to be projected on mutually different planes when they are projected on one of said main planes.

9. A gate turn-off thyristor according to claim 4, wherein said plurality of second emitter layers and a portion of one of said first and second base layers, which comes into ohmic contact with one of said anode and cathode electrodes are so arranged as to overlap with one another when they are projected on one of said main planes.

10. A gate turn-off thyristor according to claim 4, wherein said third layer portion of said first base layer is disposed at an interface of said first layer portion and said second layer portion.

11. A gate turn-off thyristor according to claim 10, wherein a fourth layer portion having an impurity concentration higher than that of said first and second layer portions but lower than that of said third layer portion is disposed between said first and second layer portions of said first base layer.

12. A gate turn-off thyristor according to claim 4, wherein said third layer portion of said first base layer is disposed inside said first layer portion.

13. A gate turn-off thyristor according to claim 4, wherein said third layer portion of said first base layer is disposed inside said second layer portion.

14. A gate turn-off thyristor according to claim 4, wherein a portion of said first base layer which comes into ohmic contact with said first main electrode has a higher impurity concentration than said first layer portion.

15. A gate turn-off thyristor (GTO) comprising a semiconductor body having a pair of main planes at oppositely facing surfaces thereof, and including, between said main planes:

a first emitter layer of a first conductivity type being provided adjacent to one of said main planes in an anode side of said GTO;

a first base layer of a second, opposite conductivity type being provided adjacent to said first emitter layer and to said one of said main planes;

a second base layer of said first conductivity type being provided adjacent to said first base layer and to the other of said main planes; and a plurality of second emitter layers of said second conductivity type being provided adjacent to said second base layer and to said other of said main planes in a cathode side of said GTO, wherein said first base layer is comprised of a first layer portion adjacent to said first emitter layer and to said one of said main planes, a second layer portion adjacent to said second base layer and having a lower impurity concentration than said first layer portion, and a third layer portion disposed at a part within said first base layer on a plane in parallel with one of said main planes in such a manner as to be spaced apart from one of said first emitter layer and from said second base layer but disposed adjacent to at least one of said first and second layer portions, and having a higher impurity concentration than said first and second layer portions, wherein said first emitter layer is in ohmic contact with a first main electrode provided on said one of said main planes of said semiconductor body, wherein each of said second emitter layers is in ohmic contact with a second main electrode corresponding thereto, provided on said other of said main planes of said semiconductor body, wherein said second base layer is in ohmic contact with a control electrode, provided at said other of said main planes of said semiconductor body in such a manner as to encompass said plurality of second emitter layers, and wherein said plurality of second emitter layers and a portion of one of said first and second base layers which comes into ohmic contact with one of said main electrodes are so arranged as to be projected on mutually different planes when they are projected on one of said main planes.

16. A gate turn-off thyristor (GTO) comprising a semiconductor body having a pair of main planes at oppositely facing surfaces thereof, and including, between said main planes:

a first emitter layer, having a p-type conductivity, being provided adjacent to one of said main planes in an anode side of said GTO;

a first base layer, having an n-type conductivity, being provided adjacent to said first emitter layer;

a second base layer, having said p-type conductivity, being provided adjacent to said first base layer and to the other of said main planes;

a second emitter layer, having said n-type conductivity, being provided adjacent to said second base layer and to the other of said main planes in a cathode side of said GTO, wherein said first base layer is comprised of a first layer portion provided adjacent to said first emitter layer, and a second layer portion provided adjacent to said second base layer and having a lower impurity concentration than said first layer portion, and wherein said first emitter layer is in ohmic contact with an anode electrode provided on said one of said main planes of said semiconductor body, said second emitter layer being in ohmic contact with a cathode electrode provided on said other of said main planes of said semiconductor body, and said second base layer being in ohmic contact with a gate electrode provided at said other of said main planes of said semiconductor body; and means, provided in an anode side of said GTO, for changing a travelling path of carriers injected from said first emitter layer into said first base layer and travelling to said second emitter layers.

17. A gate turn-off thyristor (GTO) comprising a semiconductor body having a pair of main planes at oppositely facing surfaces thereof, and including, between said main planes:

a first emitter layer of a first conductivity type being provided adjacent to one of said main planes in an anode side of said GTO;

a first base layer of a second, complementary conductivity type being provided adjacent to said first emitter layer;

a second base layer of said first conductivity type being provided adjacent to said first base layer and to the other of said main planes;

a second emitter layer of said second conductivity type being provided adjacent to said second base layer and to the other of said main planes in a cathode side of said GTO, wherein said first base layer is comprised of a first layer portion provided adjacent to said first emitter layer, and a second layer portion provided adjacent to said second base layer and having a lower impurity concentration than said first layer portion, and wherein said first emitter layer is in ohmic contact with a first main electrode provided on said one of said main planes of said semiconductor body, said second emitter layer being in ohmic contact with a second main electrode provided on said other of said main planes of said semiconductor body, and said second base layer being in ohmic contact with a control electrode provided at said other of said main planes of said semiconductor body; and means including a semi-insulating or insulating region, provided in an anode side of said GTO, for changing a travelling path of carriers injected from one of said first and second emitter layers into one of said first and second base layers and travelling to the other of said first and second emitter layers.

18. A gate turn-off thyristor comprising a p-emitter layer; an n-base layer including a first layer portion, a second layer portion, and a third layer portion; a p-base layer; and an n-emitter layer, wherein said second layer portion is separated from said p-emitter layer via said first layer portion and is short-circuited to an anode electrode by a low resistance region disposed to cover a portion of the plan view area of said first layer portion, wherein said second layer portion has an impurity concentration profile such that it attains maximum near the center of said second layer portion, and wherein said first layer portion has an impurity concentration lower than the maximum value of said second layer portion, is higher than the concentration of said third layer portion and is substantially constant.

19. A gate turn-off thyristor according to claim 18, wherein said low resistance short-circuit region includes a high concentration n-layer, said high concentration n-layer and said second layer portion of said n-base layer are comprised of impurities having mutually different diffusion constants, respectively, and said diffusion constant of said impurity for forming said second layer portion is smaller than or equal to said diffusion constant of said impurity for forming said short-circuit region.

20. A gate turn-off thyristor according to claim 18, wherein lifetime of carriers in said first and second layer portion layers is selectively controlled.

21. A gate turn-off thyristor characterized as having a structure wherein a first n-type layer which is in contact with an n-base layer and spaced apart from a p-emitter layer is brought into electrical contact with an anode electrode by a short-circuit region, said short-circuit region being disposed to cover a portion of a plan view area of said first n-type layer and having a lower resistance than said first n-type layer, and wherein a second n-type layer having a resistivity set to a substantially constant value between that of said n-base layer and said first n-type layer is disposed between said first n-type layer and said p-emitter layer.

22. A gate turn-off thyristor according to claim 21, wherein said low resistance short-circuit region includes a high concentration n-layer, said high concentration n-layer and said first n-type layer are comprised of impurities having mutually different diffusion constants, respectively, and said diffusion constant of said impurity for forming said first n-type layer is smaller than or equal to said diffusion constant of said impurity for forming said short-circuit region.

23. A gate turn-off thyristor according to claim 21, wherein lifetime of carriers in said first and second n-type layers is selectively controlled.

24. A gate turn-off thyristor characterized in that a first n-type layer, provided in an anode side, has a substantially constant impurity concentration profile, a second n-type layer is provided which is short-circuited to an anode electrode by a low resistance region on an end face of a wafer having sequentially laminated thereon a p-emitter layer, said first n-type layer, said second n-type layer having an impurity concentration profile such that it attains maximum near the center of said second n-type layer and having a lower resistance than said first n-type layer, an n-base layer which has a higher resistance than said first n-type layer, a p-base layer and an n-emitter layer of said thyristor.

25. A gate turn-off thyristor comprising a p-emitter layer, a first n-type layer, means including a second n-type layer for changing a travelling path of positive holes injected from said p-emitter layer into an n-emitter in at least a projected portion of said p-emitter layer, an n-base layer, a p-base layer and an n-emitter layer, wherein said second n-type layer, spaced apart from said p-emitter layer, is short-circuited to an anode electrode by a low resistance region disposed partially into said second n-type layer, and wherein said first n-type layer has an impurity concentration lower than a maximum value of that of said second n-type layer, is higher than a concentration of said n-base layer and is substantially constant.

26. A gate turn-off thyristor comprising a semiconductor body having a pair of main planes at oppositely facing surfaces thereof, and including, between said main planes:

a first emitter layer of a first conductivity type being provided adjacent to one of said main planes in an anode side of said thyristor;

a first base layer of a second, opposite conductivity type being provided adjacent to said first emitter layer;

a second base layer of said first conductivity type being provided adjacent to said first base layer and to the other of said main planes; and a plurality of second emitter layers of said second conductivity type being provided adjacent to said second base layer and to said other of said main planes in a cathode side of said thyristor, each second emitter layer being associated with a respective one of plural unit devices comprising said thyristor, wherein said first base layer is comprised of a first layer portion provided adjacent to said first emitter layer, a second layer portion provided adjacent to said second base layer, and a plurality of third layer portions which are respectively disposed within said first base layer on a plane in parallel with one of said main planes in such a manner as to be spaced apart from said first emitter layer and from said second base layer but disposed adjacent to at least one of said first and second layer portions, said third layer portions being arranged such that each third layer portion overlaps a respective one of said second emitter layers when both are projected on one of said main planes, and said third layer portions having plan view areas, respectively, determined as a function of spacing distances thereof from a take-out gate electrode of said thyristor such that a more distantly disposed one of said third layer portions has an area greater in size than that of another one of said third layer portions disposed nearer to said take-out gate electrode, wherein said first emitter layer is in ohmic contact with a first main electrode provided on said one of said main planes of said semiconductor body, wherein each of said second emitter layers is in ohmic contact with a second main electrode corresponding thereto, provided on said other of said main planes of said semiconductor body, and wherein said second base layer is in ohmic contact with a control electrode, provided at said other of said main planes of said semiconductor body in such a manner as to encompass said plurality of second emitter layers.

27. A gate turn-off thyristor according to claim 26, wherein said first emitter layer is dividedly disposed as plural first emitter layers of said unit devices, said first emitter layers having widths determined as a function of spacing distances thereof from said take-out gate electrode such that a more distantly disposed one of said first emitter layers has a width less than that of another one of said first emitter layers disposed nearer to said take-out gate electrode.

28. A gate turn-off thyristor according to claim 26, wherein an impurity concentration of said first emitter layer decreases either progressively or step-wise with an increasing distance of said emitter layer from said take-out gate electrode.

29. A gate turn-off thyristor comprising a semiconductor body having a pair of main planes at oppositely facing surfaces thereof, and including, between said main planes:

a first emitter layer of a first conductivity type being provided adjacent to one of said main planes in an anode side of said thyristor;

a first base layer of a second, opposite conductivity type being provided adjacent to said first emitter layer;

a second base layer of said first conductivity type being provided adjacent to said first base layer and to the other of said main planes;

a plurality of second emitter layers of said second conductivity type being provided adjacent to said second base layer and to said other of said main planes in a cathode side of said thyristor, each second emitter layer being associated with a respective one of plural unit devices comprising said thyristor, wherein said first base layer is comprised of a first layer portion provided adjacent to said first emitter layer, and a second layer portion provided adjacent to said second base layer, wherein said first emitter layer is in ohmic contact with a first main electrode provided on said one of said main planes of said semiconductor body, wherein each of said second emitter layers is in ohmic contact with a second main electrode corresponding thereto, provided on said other of said main planes of said semiconductor body, and wherein said second base layer is in ohmic contact with a control electrode, provided at said other of said main planes of said semiconductor body in such a manner as to encompass said plurality of second emitter layers; and means, disposed in said first base layer, for changing a travelling path of carriers, associated with each of said plural unit devices, injected from said first emitter layer into said first base layer and travelling to said second emitter layers, respectively, wherein a degree to which the travelling paths of the carriers are changed is a function of distances of respective ones of said plural unit devices from a take-out electrode of said thyristor, such that the more distantly disposed unit devices are characterized as having a greater degree of change in the travelling paths of carriers in relation to that of unit devices disposed relatively closer to said take-out electrode.

30. A gate turn-off thyristor according to claim 29, wherein said first emitter layer is dividedly disposed as plural first emitter layers of said unit devices, said first emitter layers having widths determined as a function of spacing distances thereof from said take-out gate electrode such that a more distantly disposed one of said first emitter layers has a width less than that of another one of said first emitter layers disposed nearer to said take-out gate electrode.

31. A gate turn-off thyristor according to claim 29, wherein an impurity concentration of said first emitter layer decreases either progressively or step-wise with an increasing distance of said emitter layer from said take-out gate electrode.

32. A gate turn-off thyristor comprising a semiconductor body having a pair of main planes at oppositely facing surfaces thereof, and including, between said main planes:

a first emitter layer of a first conductivity type being provided adjacent to one of said main planes in an anode side of said thyristor;

a first base layer of a second, opposite conductivity type being provided adjacent to said first emitter layer;

a second base layer of said first conductivity type being provided adjacent to said first base layer and to the other of said main planes; and a plurality of second emitter layers of said second conductivity type being provided adjacent to said second base layer and to said other of said main planes, each second emitter layer being associated with a respective one of plural unit devices comprising said thyristor, wherein said first base layer is comprised of a first layer portion provided adjacent to said first emitter layer, a second layer portion provided adjacent to said second base layer, and plural third layer portions which are respectively disposed within said first base layer on a plane in parallel with one of said main planes in such a manner as to be spaced apart from said first emitter layer and from said second base layer but disposed adjacent to at least one of said first and second layer portions, said third layer portions being arranged such that each third layer portion overlaps at least one of said second emitter layers when both said third layer portion and the said at least one of said second emitter layers are projected on one of said main planes, and each of said third layer portions having an impurity concentration thereof determined as a function of a distance thereof from a take-out gate electrode of said thyristor such that a more distantly disposed one of said third layer portions has an impurity concentration greater than that of another one of said third layer portions disposed relatively closer to said take-out gate electrode, wherein said first emitter layer is in ohmic contact with a first main electrode provided on said one of said main planes of said semiconductor body, wherein each of said second emitter layers is in ohmic contact with a second main electrode corresponding thereto, provided on said other of said main planes of said semiconductor body, and wherein said second base layer is in ohmic contact with a control electrode provided at said other of said main planes of said semiconductor body in such a manner as to encompass said plurality of second emitter layers.

33. A gate turn-off thyristor according to claim 32, wherein said first emitter layer is dividedly disposed as plural first emitter layers of said unit devices, said first emitter layers having widths determined as a function of spacing distances thereof from said take-out gate electrode such that a more distantly disposed one of said first emitter layers has a width less than that of another one of said first emitter layers disposed nearer to said take-out gate electrode.

34. A gate turn-off thyristor according to claim 32, wherein an impurity concentration of said emitter layer decreases either progressively or step-wise with an increasing distance of said emitter layer from said take-out gate electrode.

* * * * *